(12) United States Patent
Takahashi et al.

(10) Patent No.: US 6,195,134 B1
(45) Date of Patent: Feb. 27, 2001

(54) HORIZONTAL ELECTRON-BEAM DEFLECTOR, AUTOMATIC FREQUENCY CONTROLLER, AND VIDEO SIGNAL RECEIVER

(75) Inventors: Shinji Takahashi, Kanagawa; Takatomo Nagamine, Chiba, both of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/232,695

(22) Filed: Jan. 19, 1999

(30) Foreign Application Priority Data

Jan. 19, 1998 (JP) .................................................. 10-007882

(51) Int. Cl.[7] .............................. H04N 5/50; H04N 3/20; H04N 5/68; H04N 3/223; H03L 7/00
(52) U.S. Cl. ...................... 348/735; 348/735; 348/173; 348/380; 348/536; 348/540; 348/704
(58) Field of Search ................................. 348/735, 704, 348/173, 377, 378, 380, 501, 509, 530, 531, 536, 540, 541, 542, 543, 544, 545, 546

(56) References Cited

U.S. PATENT DOCUMENTS

| | | | |
|---|---|---|---|
| 4,351,001 | * 9/1982 | McGinn et al. ....................... | 358/158 |
| 4,396,948 | * 8/1983 | Fernsler et al. ....................... | 358/158 |
| 4,467,389 | * 8/1984 | Hosoya .................................. | 358/159 |
| 4,510,527 | * 4/1985 | Den Hollander ..................... | 358/158 |
| 4,814,878 | * 3/1989 | Kishi et al. .......................... | 358/148 |
| 4,992,708 | * 2/1991 | Kashiwagi ............................ | 315/411 |
| 5,208,517 | * 5/1993 | Beppu ................................... | 315/364 |
| 5,272,532 | * 12/1993 | Akiba ................................... | 358/158 |
| 5,315,387 | * 5/1994 | Tachibana ............................ | 348/521 |
| 5,331,347 | * 7/1994 | Wu ....................................... | 348/536 |
| 5,608,462 | * 3/1997 | Maas et al. .......................... | 348/531 |
| 5,619,276 | * 4/1997 | Christopher et al. ................ | 348/541 |
| 5,621,485 | * 4/1997 | Terao et al. .......................... | 348/735 |
| 5,677,743 | * 10/1997 | Terao et al. .......................... | 348/735 |
| 5,754,015 | * 5/1998 | Nagaoki et al. ..................... | 315/411 |

\* cited by examiner

Primary Examiner—John K. Peng
Assistant Examiner—Paulos Natnael
(74) Attorney, Agent, or Firm—Ronald P. Kananen; Rader, Fishman & Grauer

(57) ABSTRACT

A horizontal electron-beam deflector capable of preventing circuits from being damaged due to disturbance such as electric discharge with a simple and small circuit configuration, wherein an AFC circuit inputs a control signal indicating a frequency from a computer, the control signal is output to a deflection circuit, the AFC circuit generates a horizontal synchronization pulse signal, and the deflection circuit generates a horizontal deflection signal while controlling a voltage by using the control signal input from the AFC circuit.

14 Claims, 17 Drawing Sheets

|  |  | 0 | 1 | 2 | 3 | 4 | 5 | 6 | 7 |
|---|---|---|---|---|---|---|---|---|---|
| FIG. 11A | f0~f7 | 0 | 0 | 0 | 0 | 0 | 0 | 0 | 0 |
|  |  | 1 | 0 | 0 | 0 | 0 | 0 | 0 | 0 |
|  | g0~g7 | 0 | 0 | 0 | 0 | 0 | 0 | 0 | 0 |
| FIG. 11B | f0~f7 | 0 | 1 | 0 | 0 | 0 | 0 | 0 | 0 |
|  | g0~g7 | 0 | 0 | 0 | 1 | 1 | 0 | 0 | 1 |
| FIG. 11C | f0~f7 | 0 | 0 | 1 | 0 | 0 | 0 | 0 | 0 |
|  | g0~g7 | 0 | 0 | 1 | 0 | 0 | 0 | 0 | 0 |
| FIG. 11D | f0~f7 | 0 | 0 | 0 | 1 | 0 | 0 | 0 | 0 |
|  | g0~g7 | 0 | 0 | 0 | 1 | 0 | 0 | 0 | 0 |
| FIG. 11E | f0~f7 | 0 | 0 | 0 | 0 | 1 | 0 | 0 | 0 |
|  | g0~g7 | 1 | 1 | 0 | 0 | 1 | 1 | 0 | 0 |
| FIG. 11F | f0~f7 | 0 | 0 | 0 | 0 | 0 | 1 | 0 | 0 |
|  | g0~g7 | 1 | 0 | 0 | 1 | 1 | 1 | 0 | 0 |
| FIG. 11G | f0~f7 | 0 | 0 | 0 | 0 | 0 | 0 | 1 | 0 |
|  | g0~g7 | 0 | 0 | 0 | 1 | 1 | 0 | 0 | 1 |
| FIG. 11H | f0~f7 | 0 | 0 | 0 | 0 | 0 | 0 | 0 | 1 |
|  | g0~g7 | 1 | 0 | 1 | 1 | 1 | 1 | 1 | 1 |

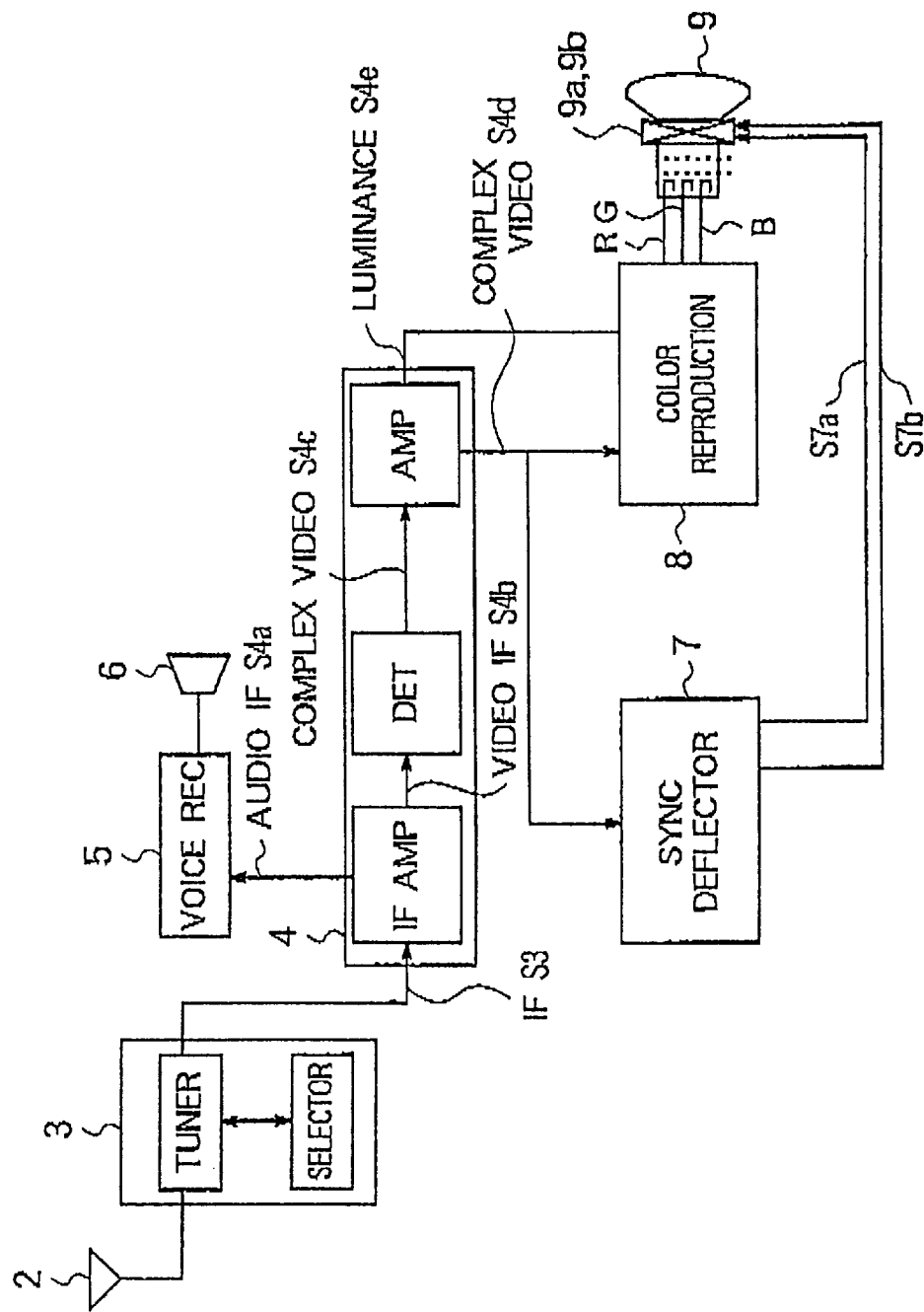

PRIOR ART

HORIZONTAL ELECTRON-BEAM DEFLECTOR, AUTOMATIC FREQUENCY CONTROLLER, AND VIDEO SIGNAL RECEIVER

BACKGROUND OF THE INVENTION

1. Field of the Invention

The present invention relates to a horizontal electron-beam deflector, an automatic frequency controller (AFC), and a video signal receiver.

2. Description of the Related Art

First, the configuration of a general color television receiver will be explained.

FIG. 12 is a view of the configuration of a general color television receiver.

As shown in FIG. 12, a color television receiver comprises an antenna 2, a station selector 3, a video signal receiver 4, an audio signal receiver 5, a speaker 6, a synchronization signal deflector 7, a color signal reproducing portion 8, and a color video display tube 9.

In such a color television receiver, a signal of a desired channel is selected by the station selector 3 among television signals received by the antenna 2, and an intermediate frequency (IF) signal S3 is generated from the signal.

The intermediate frequency signal S3 is amplified by an IF amplifier 41 in the video signal receiver 4 and divided into an audio intermediate frequency (IF) signal S4a and a video intermediate frequency (IF) signal S4b. The audio IF signal S4a applied to the audio signal receiver 5 is detected therein and a television audio signal is extracted. Audio in accordance with the television audio signal is output from the speaker 6.

In the video signal receiver 4, the video IF signal S4b is detected at a detector 42 and a complex video signal S4c is extracted. The complex video signal S4c is amplified by an amplifier 43 and output to the synchronization signal deflector 7 and the color signal reproducing portion 8 as a complex video signal S4d. Also, the complex video signal S4c is output to the color signal reproducing portion 8 as a luminance signal S4e via a trap circuit and a delay circuit.

In the color signal reproducing portion 8, a color signal is extracted from the complex video signal S4d and the luminance signal S4e, and three primary colors R (red), G (green), and B (blue) are generated and output to the color video display tube 9.

The synchronization signal deflector 7, as shown in FIG. 13, comprises a synchronization circuit 7a, a vertical deflection circuit 7b, and a horizontal deflection circuit 7c. In the synchronization circuit 7a, a vertical synchronization signal S7a1 and a horizontal synchronization signal S7a2 are extracted from the complex video signal S4d and output respectively to the vertical deflection circuit 7b and the horizontal deflection circuit 7c.

In the vertical deflection circuit 7b, a vertical deflection signal S7a is generated and output to a vertical deflection coil 9b. As a result, in the color video display tube 9, an electron beam emitted from a cathode is deflected in the vertical direction before reaching a fluorescent surface of the color video display tube 9 due to a magnetic field by the vertical deflection coil 9b.

In the horizontal deflection circuit 7c, a horizontal deflection signal S7b is generated and output to a horizontal deflection coil 9a. As a result, in the color video display tube 9, an electron beam emitted from a cathode is deflected in the horizontal direction due to the magnetic field by the horizontal deflection coil 9a.

There is known a color television receiver with a multi-scanning function capable of receiving and displaying a television signal having a synchronization signal of a predetermined frequency range of, for example, 31 kHz to 60 kHz.

A synchronization signal deflector in such a color television receiver with such a multiscanning function has to detect the frequency of a synchronization signal included in the received television signal and control internal electronic circuits based on the results of the detection. The configuration of the synchronization signal deflector differs between a color television receiver with a multi scanning function and another without the function.

FIG. 14 is a view of the configuration of a horizontal deflecting circuit 7c of a color television receiver with a multiscanning function of the related art.

As shown in FIG. 14, the horizontal deflection circuit 7c comprises a computer 10, an AFC circuit 11, and a deflection circuit 12.

The computer 10 detects a frequency of the input horizontal synchronization signal S7a2 and outputs independent control signals S10a and S10b indicating the detected frequency to the deflection circuit 12 and the AFC circuit 11 respectively. In the computer 10, the control signal S10a and the control signal S10b are synchronized for output.

Here, each bit of the control signal S10a is used to respectively control the on/off operation of a corresponding switch built in the deflection circuit 12 due to the characteristics of the circuit configuration of the deflection circuit 12, which will be explained below. Namely, the control signal S10a is not decoded in the deflection circuit 12.

The control signal S10b is output to the AFC circuit 11 via a serial bus which is connected to a plurality of circuits, such as a control circuit for adjusting the brightness of a display, color tone, contour of image, and so fourth. Therefore, the control signal S10b, in addition to a frequency of the horizontal synchronization signal S7a2, includes data and the like: to specify a circuit for outputting the control signal S10b. The control signal S10b is decoded in the AFC circuit 11 for use.

FIG. 15 is a view of the configuration of the AFC circuit 11.

As shown in FIG. 15, the AFC circuit 11 comprises a register 21, a current source 22, an oscillation circuit 23, and a wiring group 24.

The register 21 is, for example, an 8-bit register which receives as input from the computer 10 an 8-bit control signal 10b indicating a frequency and stores bit data $f_0$ to $f_7$. The register 21 outputs the stored control signal S10b as a control signal S21 via the 8-bit wiring group 24 to the current source 22. Here, the wiring group 24 connects the 8-bit register with switches 26a to 26h, respectively.

The current source 22 comprises constant current sources 25a to 25h and the switches 26a to 26h.

The constant current sources 25a, 25b, 25c, 25d, 25e, 25f, 25g, and 25h respectively output constant currents I, 2I, 4I, 8I, 16I, 32I, 64I, and 128I, where I indicates a unit current. One ends of the switches 26a, 26b, 26c, 26d, 26e, 26f, 26g, and 26h are connected to the oscillation circuit 23 and the other ends are respectively connected to the constant current sources 25a, 25b, 25c, 25d, 25e, 25f, 25g, and 25h. The switches 26a, 26b, 26c, 26d, 26e, 26f, 26g, and 26h are, for example, turned on the data $f_0$, $f_1$, $f_2$, $f_3$, $f_4$, $f_5$, $f_6$, and $f_7$ are at a high level, that is "1", and turned off when the data is at a low level, that is "0". The current source 22 outputs a current i equivalent to a total summation of the constant currents output from the constant current sources 25a to 25h corresponding to the turned-on switches among the switches 26a to 26h to the oscillation circuit 23. In the current source 22, the constant currents 2I, 4I, 8I, 16I, 32I, 64I, and 128I are defined as powers of 2 of a reference constant current I, therefore the computer 10 generates the control signal S10b of a digital value proportional to the frequency of the horizontal synchronization pulse signal S11.

The oscillation circuit 23 controls the frequency of an oscillation signal output from a built-in voltage-controlled oscillation circuit (VCO) by the current i from the current source 22 and phase-locks the oscillation signal to the horizontal synchronization signal S7a to generate a timing signal. The oscillation circuit 23 generates a horizontal synchronization pulse signal S11 by using a comparison signal S12 corresponding to a fly-back pulse signal from the deflection circuit 12 and the timing signal.

FIG. 16 is a view of the configuration of a deflection circuit 12.

As shown in FIG. 16, the deflection circuit 12 generates a horizontal deflection signal (fly-back pulse) S7a in accordance with the horizontal synchronization pulse signal S11 shown in FIG. 17A at a collector of a transistor $Tr_2$ and outputs the horizontal deflection signal S7a shown in FIG. 17B to the horizontal deflection coil 9a of the color video display tube 9. At this time, the potential of a terminal 34 of a coil $L_3$ is controlled by a controller 33 in accordance with the control signal S10a and a peak voltage of the horizontal deflection signal S7a is maintained at a constant regardless of the frequency of the horizontal synchronization pulse signal S11.

Specifically, the controller 33 applies a high level voltage to the terminal 34 of the coil $L_3$ when the frequency indicated by the control signal S10a is high, and applies a low level voltage to the terminal 34 of the coil $L_3$ when the frequency indicated by the control signal S10a is low. Namely, in accordance with the change of the frequency of the received television signal, the peak voltage of the horizontal deflection signal S7a generated at the collector of the transistor $Tr_2$ changes. Accordingly, the potential to be applied to the terminal 34 of the coil $L_3$ is changed in order to correct the change of the peak voltage of the horizontal deflection signal S7a, therefore the peak voltage of the horizontal deflection signal S7a is maintained constant.

Also, there is known a color television receiver with a point scanning function capable of receiving and displaying a video signal having a synchronization signal of a fixed predetermined frequency.

An AFC circuit in the color television receiver with such a point scanning function, for example, as shown in FIG. 18, has constant current sources 125a to 125f for respectively outputting constant currents $I_0$ to $I_7$ for obtaining a horizontal synchronization pulse signal S11 corresponding to eight predetermined fixed frequencies and generates a control signal S21 in which only one out of eight bits becomes a high level. Then, based on the control signal S21, only one switch, which corresponds to a high level bit of the control signal S21 among the switches 126a to 126h, is turned on and outputs a current i from one constant current source among the constant current sources 125a to 125h to the oscillation circuit 23.

When using the AFC circuit shown in FIG. 18, the oscillation circuit 23 and the deflection circuit 12 are designed on the assumption that the current i is not more than a constant current $I_7$ when the constant current $I_7$ is the largest among the constant currents $I_0$ to $I_7$.

To realize such a point scanning function in the horizontal deflection circuit 7c shown in FIG. 14, it is necessary to generate the current i in the current source 22 in FIG. 15 corresponding to a constant current output from the constant current sources 125a to 125h shown in FIG. 18 in order to obtain the horizontal synchronization pulse signal S11 corresponding to the predetermined fixed frequency. Accordingly, for example, in order to obtain the current i equivalent to the constant current output from the constant current source 125a shown in FIG. 18, the on/off conditions of the switches 26a to 26h shown in FIG. 15 are calculated in the computer 10 and the 8-bit control signal S10b is generated.

However, in the color television receiver with the above multiscanning function of the related art, as shown in FIG. 14, the control signals S10a and S10b from the computer 10 are individually output to the deflection circuit 12 and the AFC circuit 11. Therefore, if the computer 10 runs out of control due to noise, electrical discharge, and the like, the synchronization between the control signals 10a and 10b may be locked out.

In this case, the timing is shifted between a voltage control of the terminal 34 of the coil $L_3$ by the controller 33 and the horizontal synchronization pulse signal S11 applied to a base of a transistor $Tr_1$ shown in FIG. 16 to thereby raise the voltage between a collector and a base of the transistor $Tr_2$ higher than a design threshold. As a result, the transistor $Tr_2$ may be destroyed.

In the horizontal deflection circuit 7c of the related art, to prevent the breakage of the internal electronic circuits even when the computer 10 runs out of control, a variety of protective circuits are provided. For example, a protective circuit is provided which constantly monitors the horizontal synchronization pulse signal S11 and the potential of the terminal 34 of the coil $L_3$ and judges whether or not the relationships between the two are maintained normally. When any unusual phenomena arise in the relationships of the two, the protective circuit forcibly supplies a predetermined potential to the base of the transistor $Tr_2$ and to the terminal 34 of the coil $L_3$ to avoid breakage.

The installation of such a protective circuit in the horizontal deflection circuit 7c requires analysis of portions of the circuit which can be destroyed when the computer 10 runs out of control at the stage of designing the horizontal deflection circuit 7c. However, such analysis is not easy work. For example, there is a possibility that the installation of the protective circuit may affect the circuit conditions and may cause some portions which originally were safe to be destroyed.

The installation of the protective circuit makes the circuit configuration of the horizontal deflection circuit 7c complicated and large in scale.

Also, as explained above, to realize the point scanning function in the horizontal deflection circuit 7c shown in FIG. 14, it is necessary to calculate the on/off conditions of the switches 26a to 27h shown In FIG. 15 in the computer 10 despite the fact that the synchronization signal of the received television signal is fixed. Thus, the processing becomes complicated.

Further, during the operation of the point scanning function, when an error occurs in calculating the control signal S10a in the computer 10, the circuit may generate a horizontal synchronization pulse signal S11 having an impossible frequency for point scanning. As a result, the deflection circuit can be damaged.

In the point scanning operation, as explained above of the control signal S10b generated in the computer 10, only one out of eight bits becomes a high level in a normal operation, however; when two bits out of eight become high in an abnormal operation, the current value of the current i may exceed the rated value. Consequently, the oscillation circuit 23, the following deflection circuit 12, and other circuits can be destroyed.

SUMMARY OF THE INVENTION

An object of the present invention is to provide a horizontal electron-beam deflector, an automatic frequency controller, and a video signal receiver capable of preventing damage to circuits caused by a disturbance such as an electric discharge with a simple and small-scaled circuit configuration.

To attain the above object, according to a first aspect of the present invention, there is provided a horizontal electron-beam deflector for generating a horizontal deflection signal to be supplied to a horizontal deflection coil for generating a magnetic field to deflect an electron beam in a horizontal direction in response to a horizontal synchronization signal extracted from a video signal, comprising a processing means for detecting a frequency of the horizontal synchronization signal and generating a control signal in response to the detected frequency; an automatic frequency controlling means having a current generating circuit for generating a current based on the control signal, an oscillation signal generating circuit for generating an oscillation signal having an oscillation frequency in accordance with the current, and a horizontal synchronization pulse signal generating circuit for generating a horizontal synchronization pulse signal based on the oscillation signal and a comparison signal in response to the horizontal synchronization signal and horizontal deflection signal; and a horizontal deflection signal generating means for generating a horizontal deflection signal based on the horizontal synchronization pulse signal while controlling a peak voltage to be maintained constant based on the control signal input from the automatic frequency controlling means.

Preferably, the automatic frequency controlling means comprises a storage circuit for storing the control signal input from the processing means and outputting the control signal stored in the storage circuit to the horizontal deflecting signal generating means.

In a horizontal electron-beam deflector of the present invention, generation of a horizontal synchronization pulse signal in an automatic frequency controlling means and control of a peak voltage of a horizontal synchronization pulse signal in a horizontal deflection signal generating means are carried out by using the same control signal output from the processing means, therefore for example, when the processing means runs out of control, synchronization of the automatic frequency controlling means and the horizontal deflecting signal generating means is maintained.

According to a second aspect of the present invention, there is provided an automatic frequency controller for generating a horizontal synchronization pulse signal in a horizontal deflection signal generating means which is used for generating a horizontal deflection signal to be supplied to a horizontal deflection coil for generating a magnetic field for deflecting an electron beam in a horizontal direction based on a horizontal synchronization signal extracted from a video signal; comprising a storage circuit for storing an input control signal in response to a frequency of the detected horizontal synchronization signal and outputting the stored control signal to the horizontal deflection signal generating means; a current generating circuit for generating a current in response to the control signal; an oscillation signal generating circuit for generating an oscillation signal having an oscillation frequency in accordance with the current; and a horizontal synchronization pulse signal generating circuit for generating a horizontal synchronization pulse signal based on the oscillation signal and a comparison signal in response to the horizontal synchronization signal and horizontal deflection signal.

According to a third aspect of the present invention, there is provided a video signal receiver for extracting a horizontal synchronization signal from a received video signal, generating a horizontal deflection signal from the horizontal synchronization signal in a horizontal electron-beam deflector, making a horizontal deflection coil generate a magnetic field in response to the horizontal deflection signal; and deflecting an electron beam emitted from a cathode to reach a fluorescent panel, comprising a processing means for detecting a frequency of the horizontal synchronization signal and generating a control signal in response to the detected frequency; an automatic frequency controlling means having a current generating circuit for generating a current based on the control signal, an oscillation signal generating circuit for generating an oscillation signal having an oscillation frequency in accordance with the current, and a horizontal synchronization pulse signal generating circuit for generating a horizontal synchronization pulse signal based on the oscillation signal and a comparison signal in response to the horizontal synchronization signal and horizontal deflection signal; and a horizontal deflection signal generating means for generating a horizontal deflection signal based on the horizontal synchronization pulse signal while controlling a peak voltage to be maintained constant based on the control signal input from the automatic frequency controlling means.

BRIEF DESCRIPTION OF THE DRAWINGS

These and other objects and features of the present invention will become clearer from the following description of the preferred embodiments given with reference to the accompanying drawings, in which:

FIGS. 11A to 11H are views showing correspondences between a control signal S61 and a control signal S62 during a point scanning operation of a decoder shown in FIG. 8;

FIG. 12 is a view of the configuration of a general color television receiver;

DESCRIPTION OF THE PREFERRED EMBODIMENTS

Below, a color television receiver according to an embodiment of the present invention will be explained.

Figure 13:
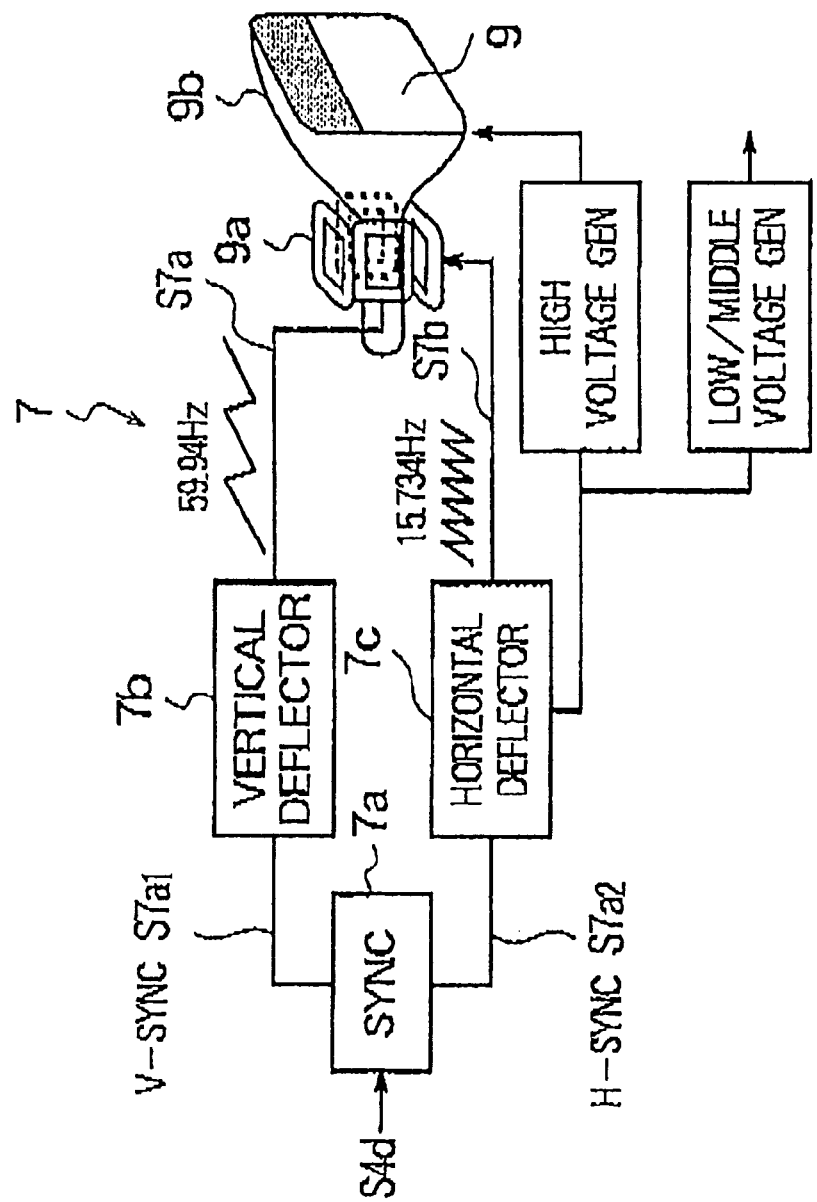
FIG. 13 is a view of the configuration of a synchronization deflection portion shown in FIG. 12.
Figure 14:
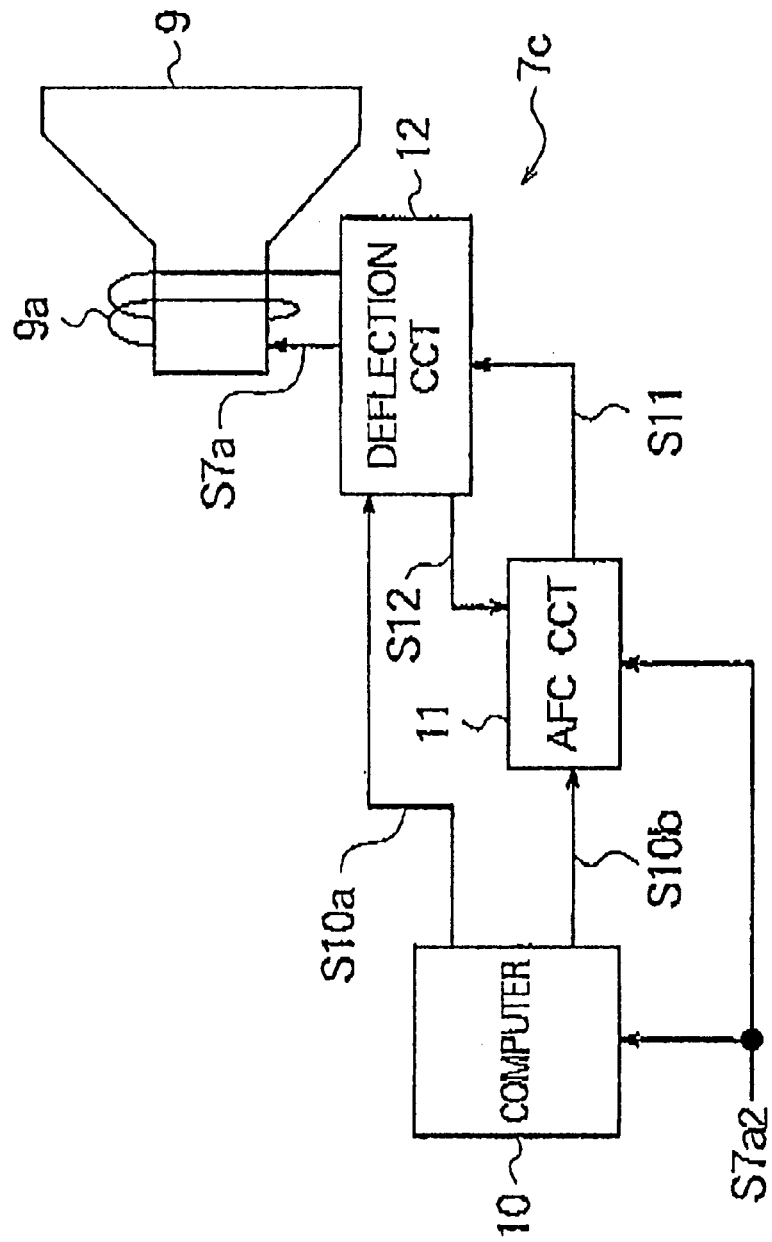
FIG. 14 is a view of the configuration of a horizontal deflection circuit of the related art shown in FIG. 13.

A color television receiver and a synchronization signal deflector of the present embodiment are respectively configured as shown in FIGS. 12 and 13. Note that a color television receiver of the present embodiment is provided with both a multiscanning function and a point scanning function and characterized in the horizontal deflection circuit.

Below, preferred embodiments will be described with reference to the accompanying drawings.

First, the configuration of the horizontal deflection circuit will be explained.

First Embodiment

Figure 1:
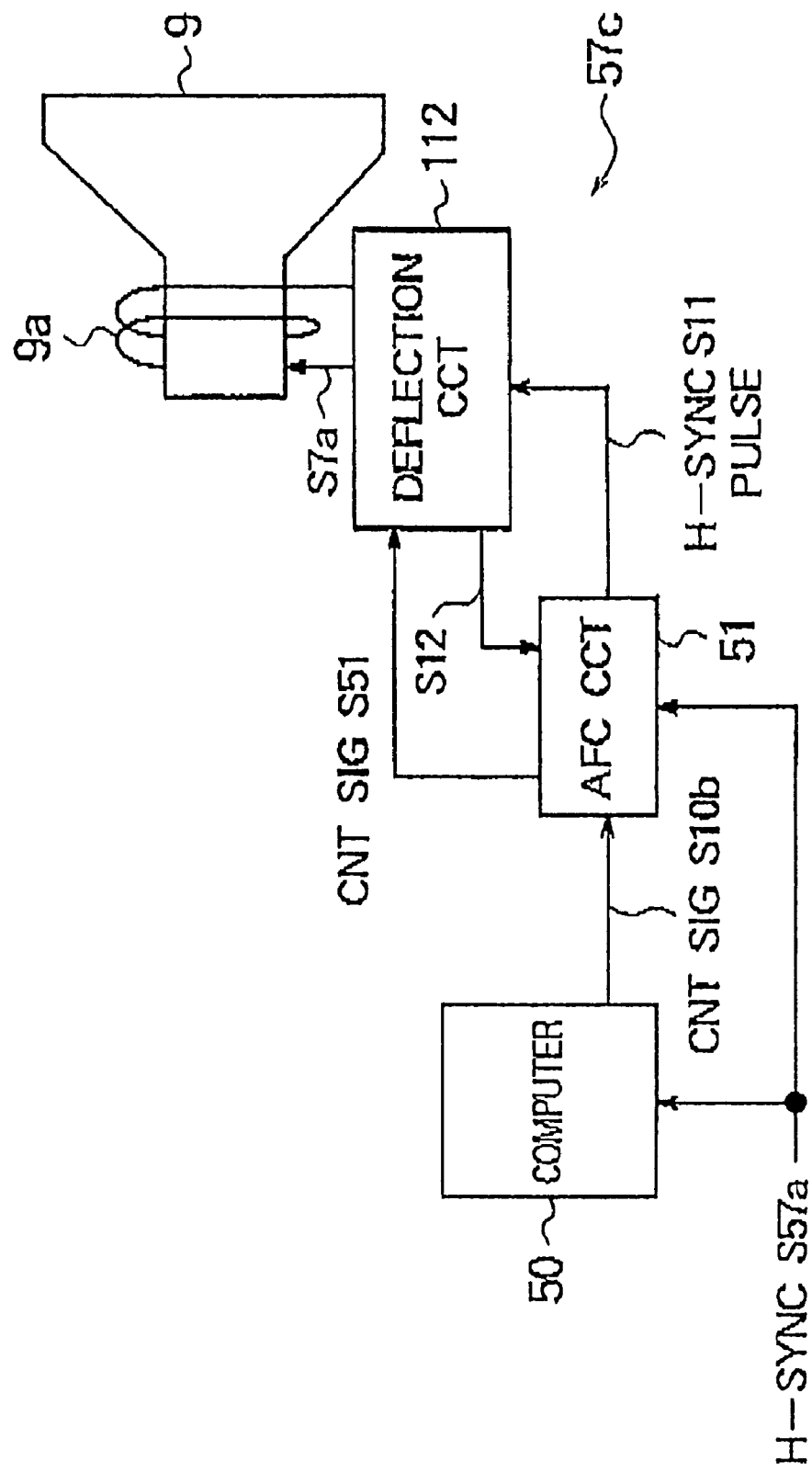
FIG. 1 is a view of the configuration of a horizontal deflection circuit of a first embodiment of the present invention.

FIG. 1 is a view of the configuration of a horizontal deflection circuit 57c of the present embodiment.

As shown in FIG. 1, a horizontal deflection circuit 57c comprises, for example, a deflection circuit 112, a computer 50, and an AFC circuit 51.

Here, the deflection circuit 112 receives as input a control signal S51 not from the computer 50 but from the AFC circuit 51.

The computer 50 detects the frequency of the input horizontal synchronization signal S57a, generates an 8-bit control signal S10b based on the detected frequency, and outputs the control signal S10b to the AFC circuit 51.

The computer 50 selects a frequency corresponding to the frequency of the detected horizontal synchronization signal S7a from 256 (=$2^8$) frequencies in the case of both a multiscanning operation and a point scanning operation. Then, the computer 50 calculates and generates the 8-bit control signal S10b indicating the selected frequency and outputs the control signal S10b to the AFC circuit 51.

AFC Circuit 51

The AFC circuit 51 generates a horizontal synchronization pulse signal S11 based on the control signal S10b input from the computer 50, a horizontal synchronization signal S7a2, and a comparison signal S12 from the deflection circuit 112.

Since the frequency of the horizontal synchronization signal S7a is high and the synchronization is easily disturbed due to noise, in the AFC circuit 51, in order to reduce the effect of noise, the stability of the frequency of the horizontal synchronization pulse signal S11 is improved by using the comparison signal S12 from the deflection circuit 112.

Also, the AFC circuit 51 outputs the control signal S10b input from the computer 50 as a control signal S51 to the deflection circuit 112.

Figure 2:
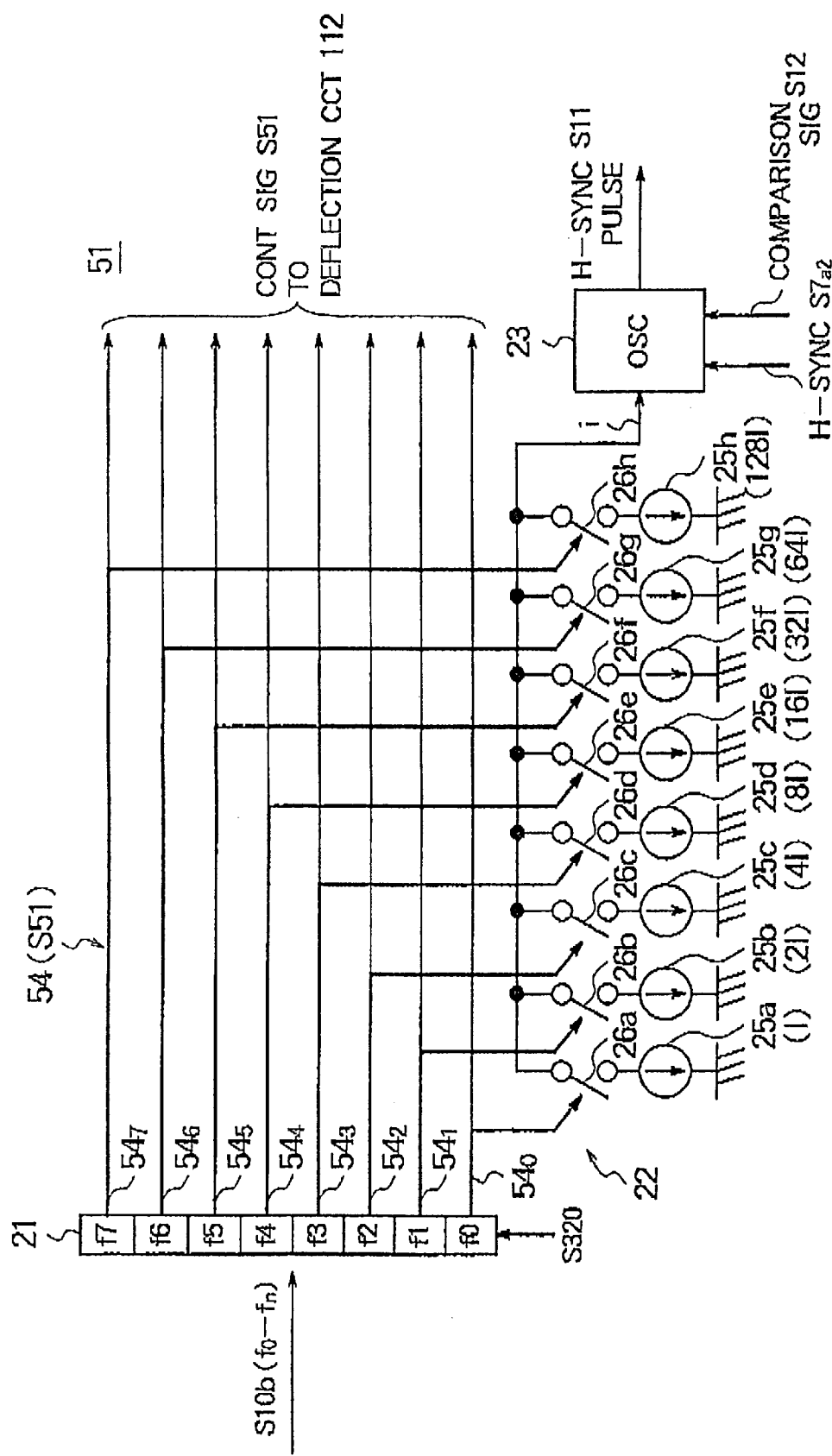
FIG. 2 is a view of the configuration of an AFC circuit shown in FIG. 1.

FIG. 2 is a view of the configuration of the AFC circuit 51 shown in FIG. 1.

As shown in FIG. 2, the AFC circuit 51 comprises a register 21, a current source 22, an oscillation circuit 23, and a wiring group 54. Here, the register 21, current source 22, and oscillation circuit 23 are the same as those explained with reference to FIG. 15.

The AFC circuit 51 is characterized in that the wiring group 54 from the register 21 connects with the current source 22 and the deflection circuit 112 and that the control signal S10b stored in the register 21 is output to the current source 22 and to the deflection circuit 112 as the control signal S51 via the wiring group 54.

Specifically, the output terminals of the storage regions of the 0th to 7th bits of the register 21 are respectively connected to the switches 26a to 26h of the current source 22 via the wiring $54_0$ to $54_7$ of the wiring group 54. Also, the output terminals of the storage regions of the 0th to 7th bits of the register 21 are connected to the deflection circuit 112 via the wiring $54_0$ to $54_7$ of the wiring group 54.

The register 21, for example, in response to a predetermined internal clock signal S320 as a trigger signal, outputs a stored control signal to the wiring group 54 as the control signal S51 and stores the control signals S10b successively.

The oscillation circuit 23 will be explained in detail.

Figure 3:
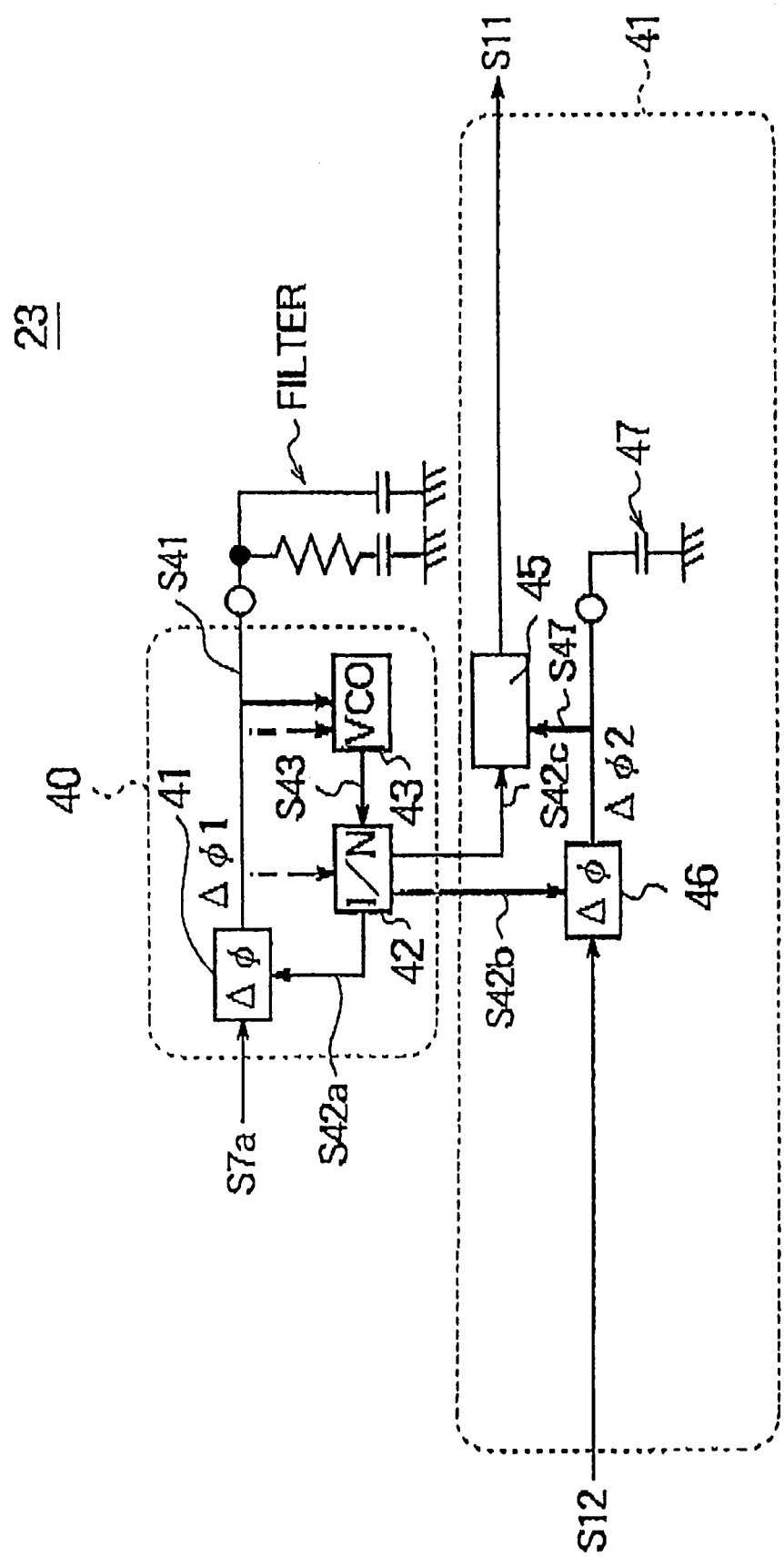
FIG. 3 is a view of the configuration of an oscillation circuit shown in FIG. 2.

FIG. 3 is a view of the configuration of the oscillation circuit 23, and FIGS. 4A to 4F are timing charts of the signals in the oscillation circuit 23.

As shown in FIG. 3, the oscillation circuit 23 comprises circuit modules 40 and 40a.

Figure 4:
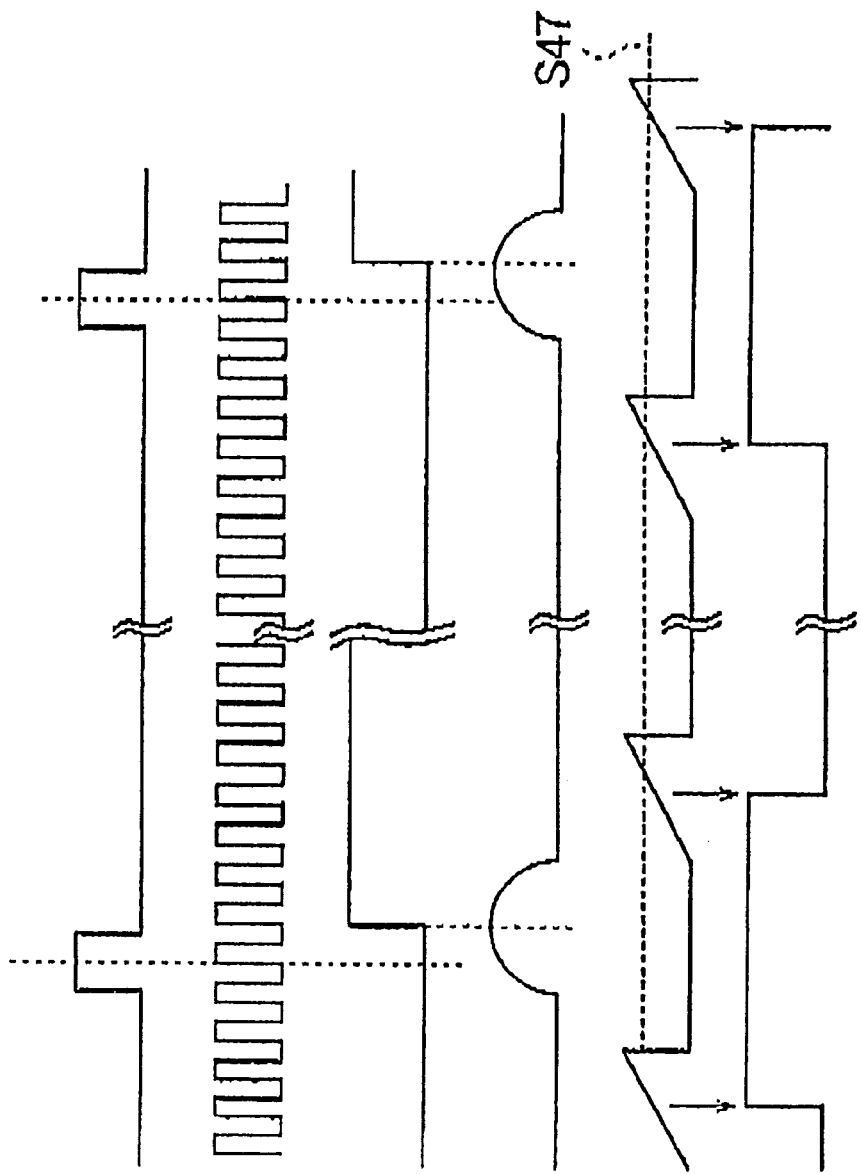
FIGS. 4A to 4F are timing charts of the signals in the oscillation circuit shown in FIG. 3.

The circuit module 40 forms a phase-locked loop (PLL) by a phase comparator 41, a counter 42 as a frequency divider, and a voltage controlled oscillator (VCO) 43. A filter is connected to an output terminal of the PLL. The phase comparator 41 compares the phases of the horizontal synchronization signal S7a shown in FIG. 4A and the count signal S42b from the counter 42 and outputs a phase difference $\Delta\phi 1$ between them as a phase difference signal S41. The phase difference signal S41 is output to the voltage controlled oscillator 43. Then, in the voltage controlled oscillator 43, an oscillation signal S43 shown in FIG. 4B is generated which has a frequency showing the phase difference $\Delta\phi 1$ and divided by N times (N is an integer) based on the current i from the current source 22 shown in FIG. 2. The frequency of the oscillation signal S43 is divided as 1/N in the counter 42 and the frequency divide signal is output to the phase comparator 41 as the count signal S42a. Then, when the PLL (circuit module 40) phase-locks the horizontal synchronization signal S7a and the signal S34 ($\Delta\phi 1$=0), the counter 42 generates a count signal S42a to phase-lock the horizontal synchronization signal S7a, a timing signal S42b shown in FIG. 4C, and a slope signal S42c shown in FIG. 4E.

The module 42a comprises a phase adjuster 45, a phase comparator 46, and a filter 47. The phase comparators 41 and 46 form a loop including the deflection circuit 112 shown in FIG. 1.

In the module 40a, the phase comparator 46 compares the phases of the timing signal S42b from the counter 42 and the comparison signal S12 from the deflection circuit 112. A phase difference signal S47 which shows the phase difference $\Delta\phi 2$ and is shown in FIG. 4E is generated. Here, the comparison signal S12 is a fly-back pulse signal equivalent to a signal generated at predetermined portions of the horizontal deflection coil 9a shown in FIG. 5, which indicates a position of a center of a video signal on a display. In the phase adjuster 45, as shown in FIGS. 4E and 4F, a horizontal synchronization pulse signal S11 is generated by slicing the slope signal S42c from the counter 42 by the phase difference signal S47. Here, the phase of the comparison signal S12 is determined by a rising edge of the horizontal synchronization pulse signal S11, so the phase of the comparison signal S12 is controlled by controlling the phase of the horizontal synchronization pulse signal S11 by the phase adjuster 45.

Figure 5:
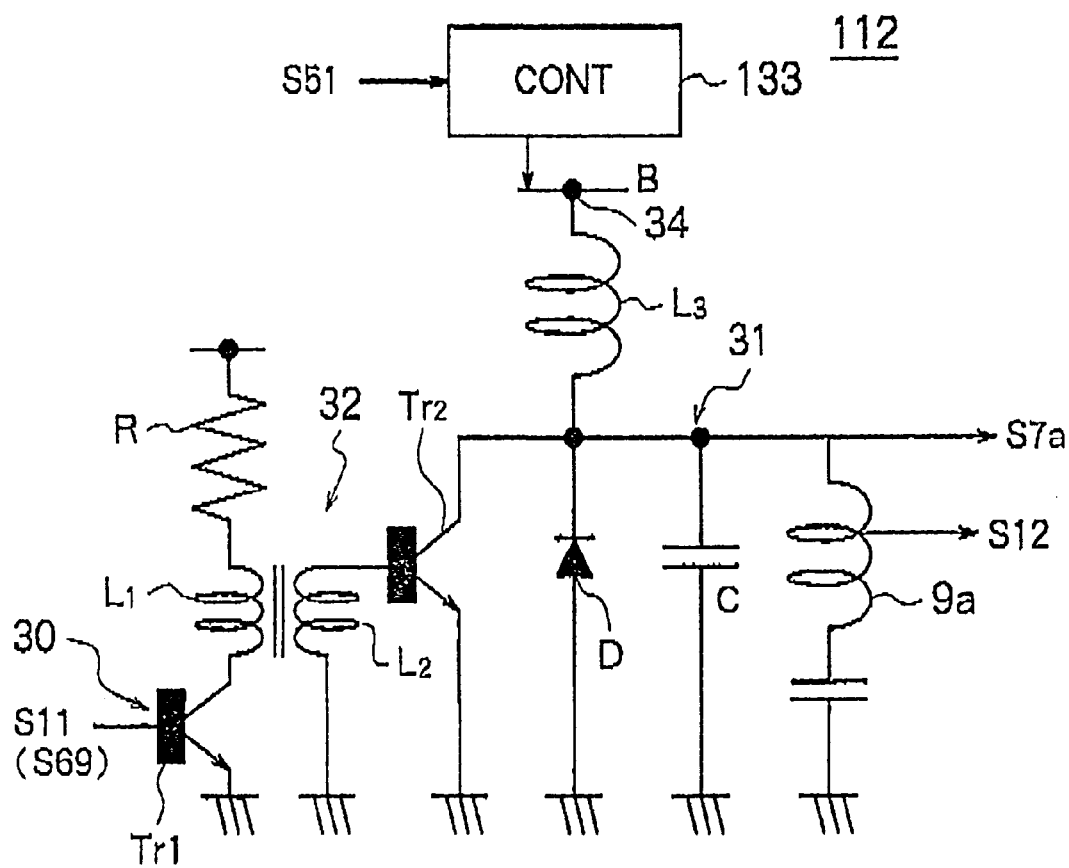
FIG. 5 is a view of the configuration of the deflection circuit shown in FIG. 1.

FIG. 5 is a view of the configuration of a deflection circuit 112.

As shown in FIG. 5, the deflection circuit 112 comprises a horizontal drive circuit 30 and a horizontal output circuit 31. The horizontal drive circuit 30 is positioned between the oscillation circuit 23 and the horizontal output circuit 31 shown in FIG. 2 and has a function of sending a sufficient base current to the transistor $Tr_2$ of the horizontal output circuit 31 without being affected by the oscillation frequency.

Figure 17A:
FIGS. 17A and 17B are views of waveforms of a horizontal synchronization pulse signal and a horizontal deflection signal of an oscillation circuit shown in FIG. 16.

The horizontal drive circuit 30 comprises a transistor $Tr_1$ with a grounded emitter. The horizontal synchronization pulse signal S11 shown in FIG. 17A from the oscillation circuit 25 is supplied to a base of the transistor $Tr_1$. A collector of the transistor $Tr_1$ is connected to a transformer 32 of the horizontal output circuit 31. Specifically, the collector of the transistor $Tr_1$ is connected to one end of a primary coil $L_1$ of the transformer 32, while the other end of the primary coil $L_1$ is given a predetermined potential via a resistor R. Also, one end of a secondary coil $L_2$ of the transformer 32 is grounded and the other end is connected to the base of the transistor $Tr_2$.

In the horizontal drive circuit 30, when the transistor $Tr_1$ is turned on in accordance with the horizontal synchronization pulse signal S11, a current flows to the resistor R and the primary coil $L_1$, an induced voltage is generated at the transformer 32, and the transistor $Tr_2$ is turned on. On the other hand, when the transistor $Tr_1$ is turned off, a back electromotive force is generated at the transformer 32 and the transistor $Tr_2$ is turned off.

The horizontal output circuit 31 comprises the transformer 32, a transistor $Tr_2$, a damper diode D, capacitor C, a coil $L_3$, and a controller 133.

Figure 17B:

The horizontal output circuit 31 utilizes a switching operation of the transistor $Tr_2$ to generate the horizontal deflection signal (fly-back pulse signal) S7a shown in FIG. 17B by the resonance phenomena of the damper diode D and the capacitor C and applies it to the horizontal deflection coil 9a.

The controller 133 controls the potential B of the terminal 34 of the coil $L_3$ based on the control signal S51 from the computer 10. Specifically, the controller 133 lowers the potential applied to the terminal 34 of the coil $L_3$ when the frequency indicated by the control signal S51 becomes high, raises the potential applied to the terminal 34 of the coil $L_3$ when the frequency indicated by the control signal S10a becomes low. As a result, a peak voltage V of a pulse included in the horizontal deflection signal S7a shown in FIG. 17B is maintained constant. Namely, the peak voltage V of the horizontal deflection signal S7a generated at a collector of the transistor $Tr_2$ is varied in accordance with the change of frequency of the received television signals. Accordingly, by changing the potential applied to the terminal 34 of the coil $L_3$ so as to correct the changes of the peak voltage V of the horizontal deflection signal S7a, the peak voltage of the horizontal deflection signal S7a is maintained constant.

The comparison signal S12 generated at a predetermined position of the horizontal deflection coil 9a is output to the AFC circuit shown in FIG. 1.

Below, an operation of the horizontal deflection circuit 57c will be explained.

In the horizontal deflection circuit 57c shown in FIG. 1, for example, in a case where the computer 50 runs out of control due to a disturbance such as a electric discharge, a control signal S10b in accordance with the out-of-control condition is output to the AFC circuit 51. The control signal S10b is stored in the register 21 shown in FIG. 2 and then output to the current source 22 and the deflection circuit 112 as the control signal S51 via the wiring group 54.

In the current source 22, on/off operations of the switches 26a to 26h are controlled based on the control signal S51, and a current i in accordance with the on/off state is output to the oscillation circuit 23.

In the oscillation circuit 23, the horizontal synchronization signal S11 is generated based on the current i, the horizontal synchronization signal S7a2, and the comparison signal S12, and the horizontal synchronization pulse signal S11 is supplied to the base of the transistor $Tr_2$ shown in FIG. 5.

On the other hand, in the controller 133 of the deflection circuit 112, the potential B at the terminal 34 of the coil $L_3$ is controlled based on the control signal S51. At this time, the generation of the horizontal synchronization pulse signal 11 in the AFC circuit 51 shown in FIG. 2 and the control of the potential B applied to the terminal 34 of the coil $L_3$ by the controller 133 shown in FIG. 5 are both carried out based on the control signal S51, so that the voltage between the collector and emitter of the transistor $Tr_2$ shown in FIG. 5 stays within the design range without exceeding the determined reference voltage.

Accordingly, even when the computer 10 runs out of control, the transistor $Tr_2$ will not be destroyed.

As explained above, according to the horizontal deflection circuit 57c, the deflection circuit 112 is not destroyed when the computer 10 runs out of control. Also, according to the horizontal deflection circuit 57c, since no special protective circuits are provided, the circuit can be simple and small in scale.

Also, according to the horizontal reelection circuit 57c, since the computer 50 outputs the control signal S10b only to the AFC circuit 51 and does not control the deflection circuit 112, the software (program) or the computer 50 can be simplified.

Also, according to the horizontal deflection circuit 57c, as shown in FIG. 2, since the point scanning operation is carried out by using the current source 22 for the multiscanning operation, the circuit can be simple and small-scaled compared with a case where the current sources are individually provided for the multiscanning and for the point scanning.

Also, according to the above horizontal deflection circuit 57c, since the current source 22 shown in FIG. 2 can also be used in the multiscanning operation, the oscillation circuit 23 and the deflection circuit 112 shown in FIG. 1 are designed not to be destroyed by the current i even when all of the switches 26a to 26h shown in FIG. 2 are turned on. Therefore, in the point scanning operation, even when an error occurs in generating the control signal S10b in the computer 50 and a plurality of bits of the control signals S10b become a high level, the oscillation circuit 23 and the deflection circuit 112 shown in FIG. 1 would not be destroyed.

Furthermore, according to the horizontal deflection circuit 57c, during a multiscanning operation, 256 frequencies are expressed by an 8-bit control signal S51. Since the controller 133 in the deflection circuit 112 decodes the control signal S51 to identify the frequency, only eight wirings are required for transferring the control signal S51 between the AFC circuit 51 and the deflection circuit 112. Thus, the wiring can be largely reduced compared with a case where 256 wirings are provided.

Second Embodiment

As explained above, in the horizontal deflection circuit 57c of the first embodiment, in a point scanning operation, the computer 50 shown in FIG. 1 calculates and generates the 8-bit control signal S10b so that the current source 22 of the AFC circuit 51 can output a current corresponding to a predetermined fixed frequency.

On the other hand, in the horizontal deflection circuit of the present embodiment, in a point scanning operation, the computer generates a control signal where each of 8 bits indicates a predetermined frequency and only one bit corresponding to the detected frequency is set to the high level. Then, the AFC circuit decodes the control signal and controls the current source.

Figure 6:
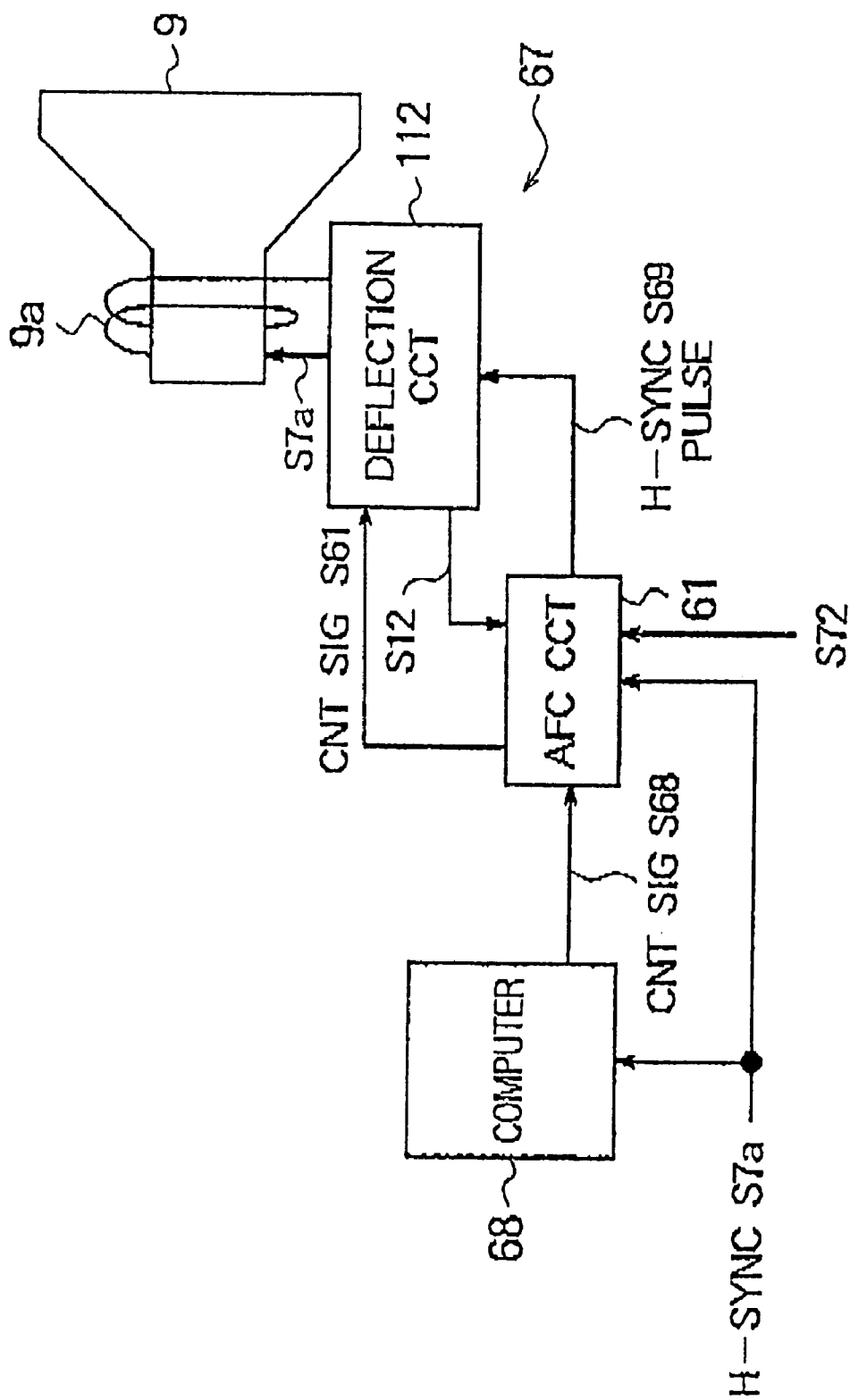
FIG. 6 is a view of the configuration of a horizontal deflection circuit of a second embodiment of the present invention.

FIG. 6 is a view of the configuration of a horizontal deflection circuit 67 of the present embodiment.

As shown in FIG. 6, the horizontal deflection circuit 67 comprises, for example, a deflection circuit 112, computer 68, and AFC circuit 61.

Here, the deflection circuit 112 is the same as the deflection circuit 112 in the horizontal deflection circuit 57c shown in FIG. 1.

Note that the AFC circuit 61 and the computer 68 are different from the AFC circuit 51 and the computer 50 shown in FIGS. 1 and 2.

The computer 68 detects the frequency of the horizontal synchronization signal S7a during a multiscanning operation, calculates an 8-bit control signal S68 indicating one frequency corresponding to the detected frequency among 256 (=$2^8$) frequencies, and outputs the control signal S68 to the AFC circuit 61. The control signal S68 is used as it is for controlling a current source 22 during a multiscanning operation in the AFC circuit 61.

Also, the computer 68 detects a fixed frequency of the horizontal synchronization circuit S7a during a point scanning operation, generates a control signal S68 wherein only one bit out of 8 bits indicating the detected fixed frequency is a high level, and outputs the control signal S68 to the AFC circuit 61.

The AFC circuit 61 outputs the control signal S68 input from the computer 68 to the deflection circuit 112 as a control signal S61.

Also, the AFC circuit 61 generates a horizontal synchronization pulse signal S69 from the control signal S68, M(multi-scan)/P(point-scan) switching signal S72, and comparison signal S12 and outputs the horizontal synchronization pulse signal S69 to the deflection circuit 112.

Figure 7:
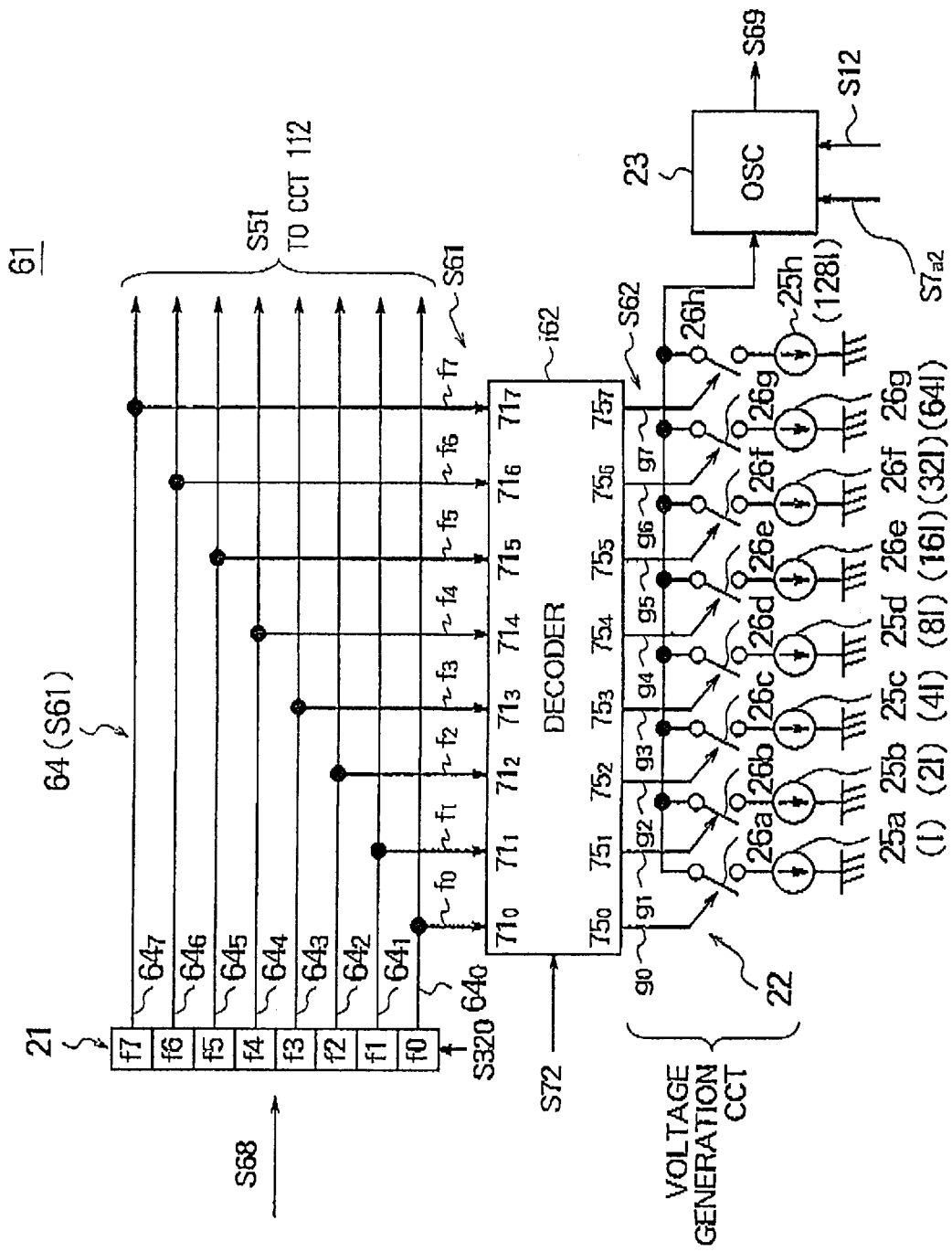
FIG. 7 is a view of the configuration of an AFC circuit shown in FIG. 6.

FIG. 7 is a view of the configuration of the AFC circuit shown in FIG. 6.

As shown in FIG. 7, the AFC circuit 61 comprises a register 21, current source 22, oscillation circuit 23, decoder 62, and wiring group 64.

Figure 15:
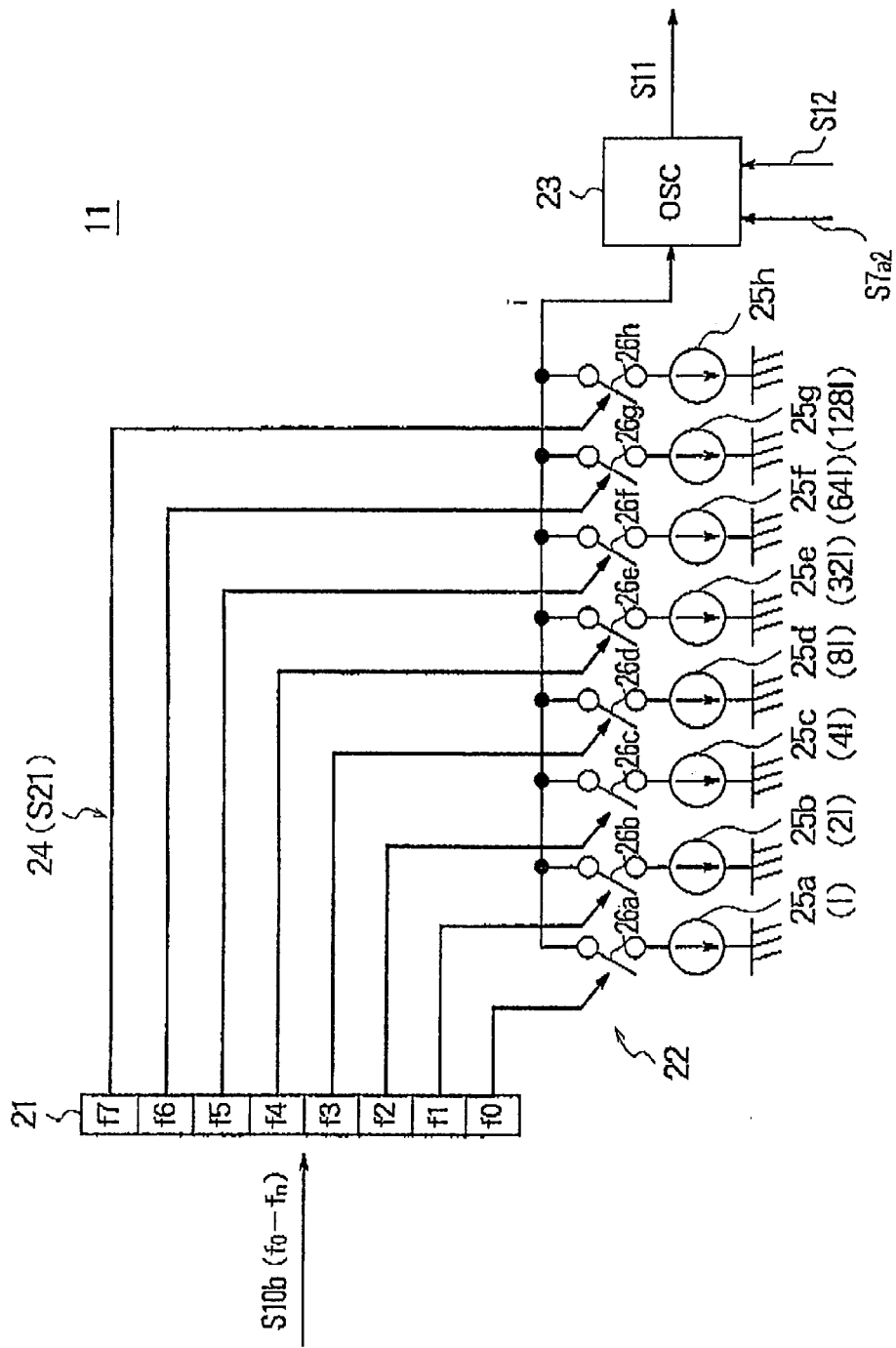
FIG. 15 is a view of the configuration of an AFC circuit shown in FIG. 14.
Figure 16:
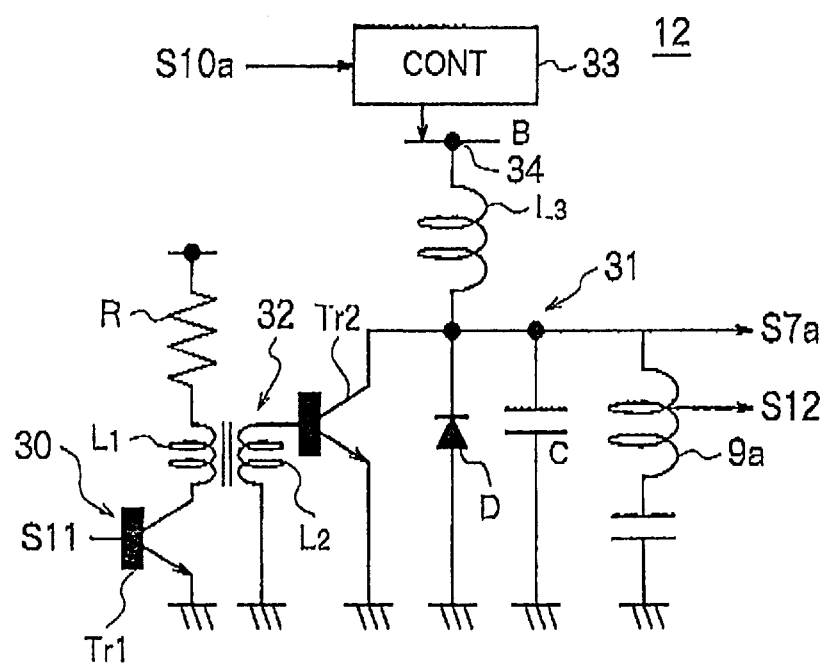
FIG. 16 is a view of the configuration of an oscillation circuit shown in FIG. 15.

The register 21, current source 22, and oscillation circuit 23 are the same as those explained with reference to FIG. 15.

The wiring group 64 comprises wiring $64_0$ to $64_7$. Output terminals of storage regions of the 0th to 7th bits of the register 21 are connected to the decoder 62 via the wiring $64_0$ to $64_7$. Also, the output terminals of the storage regions of the 0th to 7th bits of the register 21 are connected to the deflection circuit 112 via the wiring $64_0$ to $64_7$.

Below, the decoder 62 will be explained.

The decoder 62 generates an 8-bit control signal S62 corresponding to the 8-bit control signal from the register 21 based on the M/P switching signal S72 generated in accordance with, for example, an operation of an input means by a user and outputs the control signal S62 to the current source 22.

Figure 8:
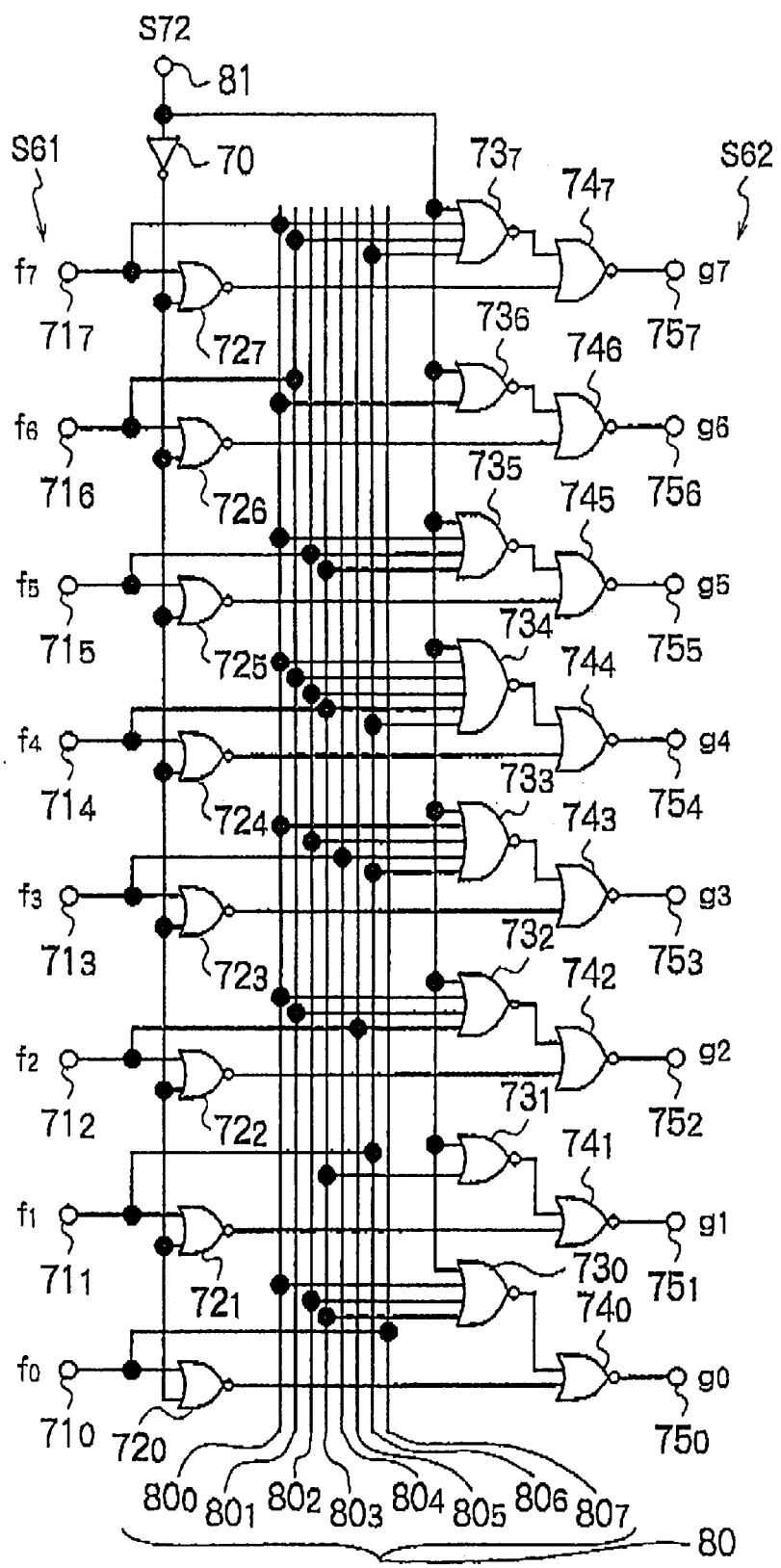
FIG. 8 is a view of the logic circuit of a decoder shown in FIG. 7.

FIG. 8 is a view of the logic circuit of the decoder 62 shown in FIG. 7.

As shown in FIG. 8, the decoder 62 comprises an NOT circuit 70, input terminals $71_0$ to $71_7$, NOR circuits $72_0$ to $72_7$, NOR circuits $73_0$ to $73_7$, NOR circuits $74_0$ to $74_7$, output terminals $75_0$ to $75_7$, a decoding use wiring group 80, and a switching signal input terminal 81.

The decoding use wiring group 80 comprises decoding use wiring $80_0$ to $80_7$.

In the decoder 62, the switching signal input terminal 81 is connected to an input terminal of the NOT circuit 70 and input terminals of NOR circuits $73_0$ to $73_7$. The M/P switching signal S72 is supplied to the switching signal input terminal 81 by a not illustrated operation means.

Also, an output terminal of the NOT circuit 70 is connected to input terminals of the NOR circuits $72_0$ to $72_7$.

The input terminals $71_0$ to $71_7$ are respectively connected to the wiring $64_0$ to $64_7$ shown in FIG. 7. Also, the input terminals $71_0$ to $71_7$ are connected to the other input terminals of the NOR circuits $72_0$ to $72_7$.

The decoding use wiring group $80_0$ is connected to an input terminal $71_7$, an input terminal of the NOR circuit $73_0$, an input terminal of the NOR circuit $73_2$, an input terminal of the NOR $73_3$, an input terminal of the NOR circuit $73_4$, an input terminal of the NOR circuit $73_5$, an input terminal of the NOR circuit $73_6$, and an input terminal of the NOR circuit $73_7$.

The decoding use wiring $80_1$ is connected to the input terminal $71_6$, an input terminal of the NOR circuit $73_2$, an input terminal of the NOR circuit $73_4$, and an input terminal of the NOR circuit $73_7$.

The decoding use wiring $80_2$ is connected to the input terminal $71_5$, an input terminal of the NOR circuit $73_0$, an input terminal of the NOR circuit $73_3$, an input terminal of the NOR circuit $73_4$, and an input terminal of the NOR circuit $73_5$.

The decoding use wiring $80_3$ is connected to the input terminal $71_4$, an input terminal of the NOR circuit $73_0$, an input terminal of the NOR circuit $73_1$, an input terminal of the NOR circuit $73_4$, and an input terminal of the NOR circuit $73_5$.

The decoding use wiring $80_4$ is connected to the input terminal $71_3$ and an input terminal of the NOR circuit $73_3$.

The decoding use wiring $80_5$ is connected to the input terminal $71_2$ and an input terminal of the NOR circuit $73_2$.

The decoding use wiring $80_6$ is connected to the input terminal $71_1$, an input terminal of the NOR circuit $73_3$, an input terminal of the NOR circuit $73_4$, and an input terminal of the NOR circuit $73_7$.

The decoding use wiring $80_7$ is connected to the input terminal $71_0$.

Output terminals of the NOR circuits $73_0$ to $73_7$ are respectively connected to input terminals of the NOR circuits $74_0$ to $74_7$.

Also, output terminals of the NOR circuits $72_0$ to $72_7$ are connected to other input terminals of the NOR circuits $74_0$ to $74_7$.

Output terminals of the NOR circuits $74_0$ to $74_7$ are respectively connected to the output terminals $75_0$ to $75_7$.

Below, the operation of the decoder 62 will be explained.

The decoder 62 performs a multi scanning operation or a point scanning operation in accordance with the M/P switching signal S72.

Specifically, the decoder 62 performs a multi scanning operation when the N/P switching signal S72 is at a high level "1", performs a point scanning operation when the N/P switching signal S72 is at a low level "0".

Multiscanning Operation

When performing a multiscanning operation, the N/P switching signal S72 becomes a high level.

When the M/P switching signal S72 becomes a high level, an input terminal connected to the switching signal input terminal 81 in the NOR circuits $73_0$ to $73_7$ becomes a high level and the output terminals of the NOR circuits $73_0$ to $73_7$ become a low level regardless of the level of the data $f_0$ to $f_7$.

Figure 9:
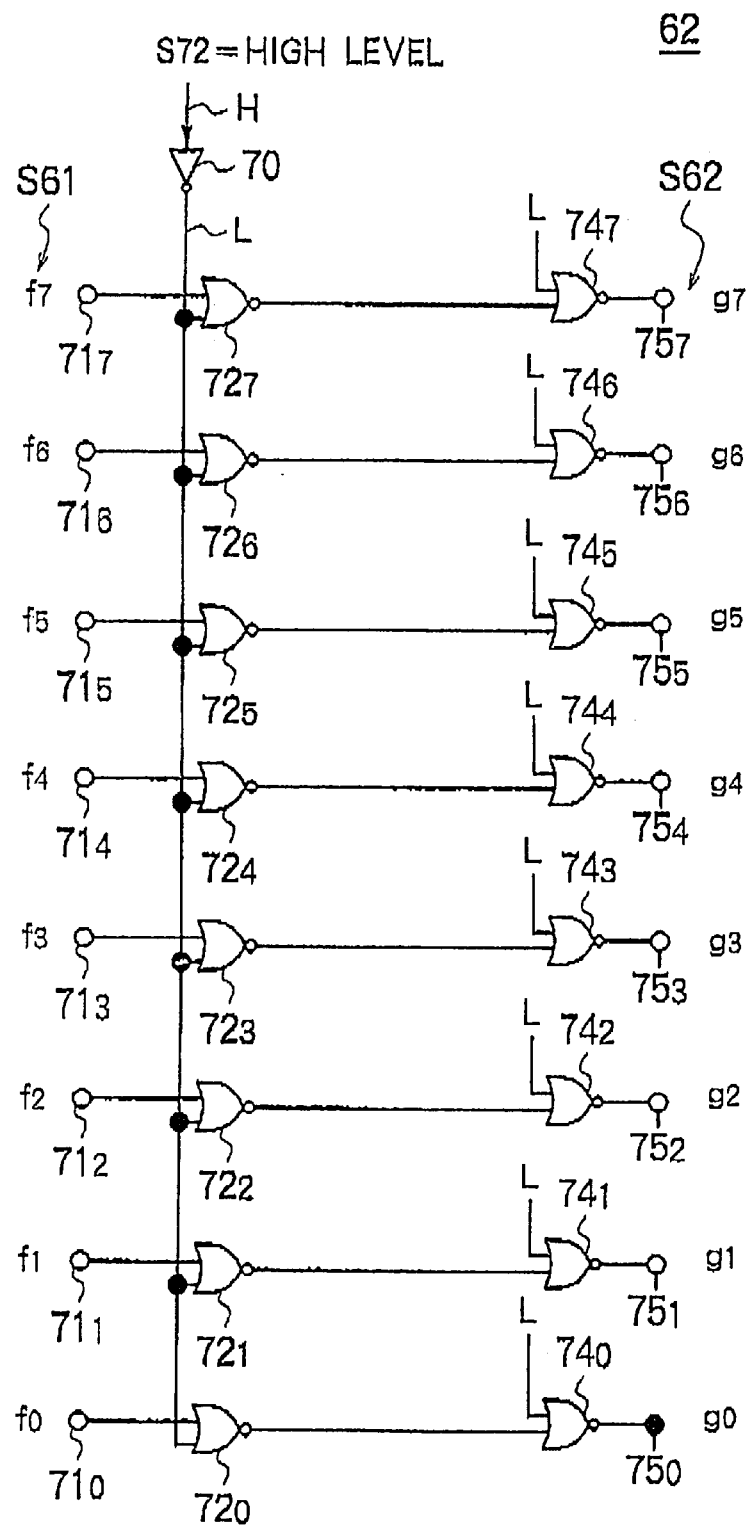
FIG. 9 is a view of an equivalent circuit during a multi-scanning operation of a decoder shown in FIG. 8.

As a result, when the M/P switching signal S72 is a high level, the logic circuit shown in FIG. 8 becomes equivalent to the logic circuit shown in FIG. 9.

Below, the operation of the multiscanning operation of the decoder 62 will be explained with reference to FIG. 9.

In the logic circuit shown in FIG. 9, an input terminal connected to an output terminal of the NOT circuit 70 in the NOR circuits $72_0$ to $72_7$ is at a low level. Thus, when the data $f_0$ to $f_7$ are at a high level, the respective output terminals of the NOR circuits $72_0$ to $72_7$ become a low level, while when the data $f_0$ to $f_7$ are at a low level, the respective output terminals of the NOR circuits $72_0$ to $72_7$ become a high level.

Also, since one input terminals of the NOR circuits $74_0$ to $74_7$ are at a low level, the respective output terminals of the NOR circuits $74_0$ to $74_7$ become a low level when the output terminals of the NOR circuits $72_0$ to $72_7$ are at a high level. The output terminals of the NOR circuits $74_0$ to $74_7$ become a high level when the output terminal of the NOR circuits $72_0$ to $72_7$ are at a low level.

Accordingly, in the decoder 62 shown in FIG. 9, levels of the data $f_0$ to $f_7$ and data $g_0$ to $g_7$ become the same. Therefore, the decoder 62 shown in FIG. 9 outputs the control signal S61 input from the input terminals $71_0$ to $71_7$ as it is to the current source 22 as a control signal S62.

Point Scanning Operation

When performing a point scanning operation, the M/P switching signal S72 becomes a low level.

When the M/P switching signal S72 becomes a low level, an input terminal connected to the NOT circuit 70 of the NOR circuits $72_0$ to $72_7$ shown in FIG. 8 becomes a high level and output terminals of the NOR circuits $72_0$ to $72_7$ become a low level. As a result, the input terminal connected to the respective output terminals of the NOR circuits $72_0$ to $72_7$ become a low level.

Figure 10:
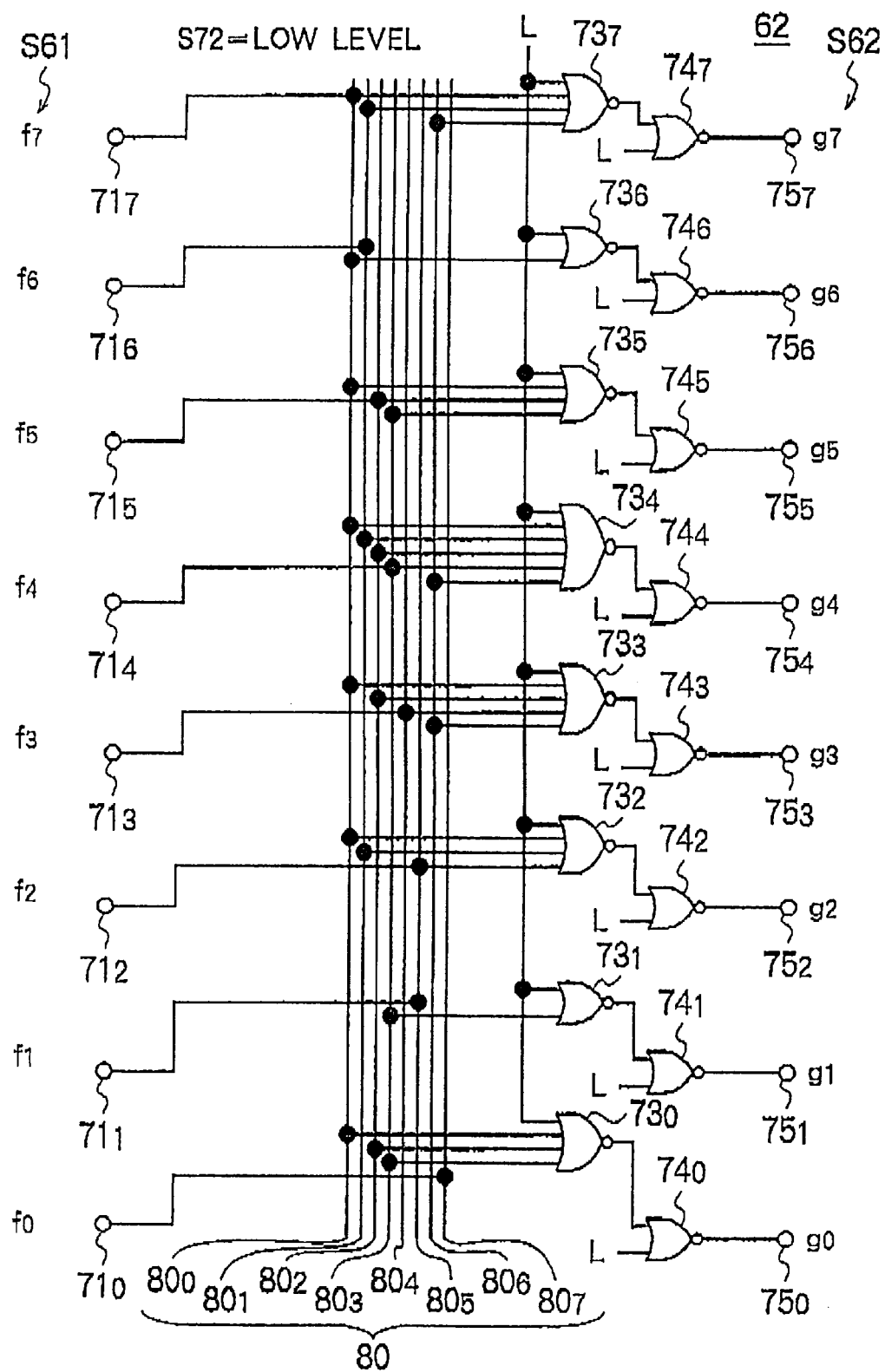
FIG. 10 is a view of an equivalent circuit during a point scanning operation of a decoder shown in FIG. 8.

As a result, when the M/P switching signal S72 is at a low level, the logic circuit shown in FIG. 8 becomes equivalent to the logic circuit shown in FIG. 10.

Below, the operation of point scanning of the decoder 62 will be explained with reference to FIG. 10.

During point scanning, a control signal S68 wherein only one bit out of eight bits is at a high level, and is output to the AFC circuit 61 from the computer 68 shown in FIG. 6.

Then, the data $f_0$ to $f_7$ comprising an 8-bit control signal S61 the same as the control signal S68 are respectively output to the input terminals $71_0$ to $71_7$ shown in FIG. 10.

When all of the data $f_4$, $f_5$, and $f_7$ are a low level, the output terminal of the NOR circuit $73_0$ becomes a high level, and the data $g_0$ output from the output terminal $75_0$ becomes a low level.

When the data $f_4$ is a low level, the output terminal of the NOR circuit $73_1$ becomes a high level, and the data $g_0$ output from the output terminal $75_1$ becomes a low level.

When all of the data $f_2$, $f_6$, and $f_7$ are at a low level, the output terminal of the NOR circuit $73_2$ becomes a high level, and the data $g_1$ output from the output terminal $75_2$ becomes a low level.

When all of the data $f_1$, $f_3$, $f_5$, and $f_7$ are at a low level, the output terminal of the NOR circuit $73_3$ becomes a high level, and the data $g_3$ output from the output terminal $75_3$ becomes a low level.

When all of the data $f_1$, $f_4$, $f_5$, $f_6$, and $f_7$ are at a low level, the output terminal of the NOR circuit $73_4$ becomes a high level, and the data $g_4$ output from the output terminal $75_4$ becomes a low level.

When all of the data $f_4$, $f_5$, $f_7$ are at a low level, the output terminal of the NOR circuit $73_5$ becomes a high level, and the data $g_5$ output from the output terminal $75_5$ becomes a low level.

When the data $f_7$ is at a low level, the output terminal of the NOR circuit $73_6$ become a high level, and the data $g_6$ output from the output terminal $75_6$ becomes a low level.

When all of the data $f_1$, $f_6$ and $f_7$ becomes a low level, the output terminal of the NOR circuit $73_7$ becomes a high level, and the data $g_7$ output from the output terminal $75_7$ becomes a low level.

Here, the data $f_0$ to $f_7$ of the control signal S61 and the data $g_0$ to $g_7$ of the control signal S62 have the relationship as shown in FIGS. 11A to 11H.

Specifically, as shown in FIG. 11A, when only the data f0 of the control signal S61 is at a high level and when all of the data $f_0$ to $f_7$ are at a low level, the data $g_0$ to $g_7$ of the control signal S62 become a low level.

As a result, all of the switches 26a to 26h shown in FIG. 7 are turned off and the current i does not flow from the current source 22 to the oscillation circuit 23.

Also, as shown in FIG. 11B, when only the data f1 of the control signal S61 is at a high level, the data $g_3$, $g_4$, and $g_7$ of the control signal S62 become a high level.

As a result, switches 26d, 26e, and 26h shown in FIG. 7 are turned on and the current i having a current value of 152I (=8I+16I+128I) is output from the current source 22 to the oscillation circuit 23.

Also as shown in FIG. 11C, when only the data f2 is at a high level, only the data $g_2$ of the control signal S62 becomes a high level.

As a result, only the switch 26c shown in FIG. 7 is turned on, and the current i having a current value of 4I is output from the current source 22 to the oscillation circuit 23.

Also, as shown in FIG. 11D, when only the data $f_3$ of the control signal S61 is at a high level, only the data $g_3$ of the control signal S62 becomes a high level.

As a result, only the switch 26d shown in FIG. 7 is turned on, and the current i having a current value of 8I is output from the current source 22 to the oscillation circuit 23.

Also, as shown in FIG. 11E, when only the data $f_4$ is a high level, the data $g_0$, $g_1$, $g_4$, and $g_5$ become a high level.

As a result, the switches 26a, 26b, 26e, and 26f shown in FIG. 7 are turned on and the current i having a current value of 51I (=I+2I+16I+32I) is output from the current source to the oscillation circuit 23.

Also, as shown in FIG. 11F, when only the data $f_5$ is at a high level, the data $g_0$, $g_3$, $g_4$, and $g_5$ become a high level.

As a result, the switches 26a, 26d, 26e, and 26f shown in FIG. 7 are turned on and a current i having a current value of 57I (=I+8I+16I+32I) is output from the current source 22 to the oscillation circuit 23.

Also, as shown in FIG. 11G, when only the data $f_6$ is a high level, the data $g_3$, $g_4$, and $g_7$ of the control signal S62 become a high level.

As a result, the switches 26d, 26e, and 26h shown in FIG. 7 are turned on, and the current i having a current value of 152I (=8I+16I+128I) is output from the current source 22 to the oscillation circuit 23.

Also, as shown in FIG. 11H, when only the data $f_7$ of the control signal S61 is a high level, the data $g_0$, $g_2$, $g_3$, $g_4$, $g_5$, $g_6$, and $g_7$ become a high level.

As a result, the switches 26a, 26c, 26d, 26e, 26f, 27$_g$, and 26h shown in FIG. 7 are turned on, and a current i having a current value of 253I (=I+4I+8I+16I+32I+64I+128I) is output from the current source 22 to the oscillation circuit 23.

In this way, in the decoder 62, during a point scanning operation, as shown in FIG. 11, an 8-bit control signal S61 comprising the data $f_0$ to $f_7$ wherein only one out of the eight bits is at a high level used in an ordinary point scanning operation is decoded to obtain an 8-bit control signal S61 comprising the data $g_0$ to $g_7$ required in generating a current corresponding to a frequency of the point scanning in the current source 22.

Next, the overall operation of a horizontal deflection circuit 67 will be explained.

Multiscanning Operation

In a multiscanning operation, the M/P switching signal S72 shown in FIG. 6 is set to a high level.

Also, in the computer 68 shown in FIG. 6, the frequency of the horizontal synchronization signal S7a is detected. Then, an 8-bit control signal S68 indicating one frequency corresponding to the detected frequency is calculated from 256 (=2⁸) frequencies. The control signal S68 is output to the AFC circuit 61.

The control signal S68 is stored in the register 21 shown in FIG. 7, then output as a control signal S61 to the controller 133 of the deflection circuit 112 shown in FIGS. 5 and 6 and to the decoder 62 shown in FIG. 7.

The controller 133 shown in FIG. 5 controls the potential of a terminal 34 of a coil $L_3$.

Also, in the decoder 62 shown in FIGS. 7, 8, and 9, the control signal S61 is output as it is to the current source 22 as a control signal S62, and a current i in accordance with the on/off condition of the switches 26a to 26h by the control signal S62 is output to the oscillation circuit 23. Then, in the oscillation circuit 23, a horizontal synchronization pulse signal S69 is generated which has an oscillation frequency in accordance with the current i, a horizontal synchronization signal S7a, and a comparison signal S12. The h orizontal synchronization pul se signal S69 is supplied to a base of the transistor $Tr_1$ shown in FIG. 5.

As a result, in the deflection circuit 112, a horizontal deflection signal S7a is generated in accordance with the horizontal synchronization pulse signal S69 and the potential of the terminal 34 of the coil $L_3$. The horizontal synchronization signal S7a is output to a horizontal deflection coil 9a of a color video display tube 9.

Point Scanning Operation

In a point scanning opera tion, the M/P switching signal S72 shown in FIG. 6 is set at a low level.

Also, the computer 68 show n in FIG. 6 detects the frequency of the horizontal synchronization signal S7a. Then a control signal S68 wherein only one bit out of 8 bits which Indicates the detected frequency is made to be a high level is generated and output to the AFC circuit 61.

The control signal S68 is being stored in the register shown in FIG. 7, then output as a control signal S61 to the controller 133 of the deflection circuit 112 shown in FIGS. 5 and 6 and to the decoder 62 shown in FIG. 7.

Then, the controller 133 shown in FIG. 5 controls the potential of the terminal 34 of the coil $L_3$.

Also, the decoder 62 shown in FIGS. 7, 8, and 10 decodes the control signal S62 by using the pattern shown in FIGS. 11A to 11H, the resultant signal is output to the current source 22 to thereby output a current i in accordance with the on/off state of the switches 26a to 26h by the control signal S62 to the oscillation circuit 23. Then, the oscillation circuit 23 generates a horizontal synchronization pulse signal S69 which has an oscillation frequency in accordance with the current i, the horizontal synchronization signal S7a, and the comparison signal S12 and supplies the horizontal synchronization pulse signal S69 to a base of the transistor $Tr_1$ shown in FIG. 5.

As a result, the deflection circuit 112 generates a horizontal deflection signal S7a in accordance with the horizontal synchronization pulse signal S69 and the potential of the terminal 34 of the coil $L_3$. The horizontal deflection signal S7a is output to the horizontal deflection coil 9a of the color video display tube 9.

In the above operation of the horizontal deflection circuit 67, in both cases of a multiscanning operation and a point scanning operation, the control of the potential of the terminal 34 of the coil $L_3$ by the controller 133 shown in FIG. 5 and the generation of a horizontal synchronization pulse signal S69 to supply to the base of the transistor $Tr_1$ by the AFC circuit 61 are carried out based on the control signal S68. Therefore, even if a computer 68 runs out of control, the voltage between a collector and emitter of the transistor $Tr_2$ can be kept within the design range without exceeding the determined reference voltage. As a result, even when the computer 68 runs out of control, the transistor $Tr_2$ will not be destroyed.

As explained above, according to the horizontal deflection circuit 67, during the point scanning operation, the computer 68 generates a control signal S68 wherein only a single bit corresponding to a required frequency is made a high level among a plurality of bits respectively indicating different frequencies to each other which are predetermined and fixed in the same way as in an ordinary point scanning operation. Therefore, in the computer 68, the processing for generating the control signal S68 can be simplified and the software can be developed easier. Namely, according to the horizontal synchronization circuit 67, in the same way as the above explained computer 50 shown in FIG. 1, it is not necessary to calculate combinations of the on/off states of the switches 26a to 26h required in generating a current corresponding to a frequency of a predetermined point scanning in the current source 22 shown in FIG. 2 during the point scanning operation.

Also, according to the horizontal deflection circuit 67, as shown in FIG. 7, the point scanning operation is carried out by using a current source 22 for a multiscanning operation, the circuit can be made simpler and smaller in scale compared with a case where current sources are individually provided for a multiscanning operation and a point scanning operation.

Also, according to the horizontal deflection circuit 67, since the current source 22 shown in FIG. 7 can be also used in a multiscanning operation, the oscillation circuit 23 and the deflection circuit 112 shown in FIG. 6 are designed not to be destroyed even by a current i in a case where all of the switches 26a to 26h shown in FIG. 7 are turned on. Therefore, in the point scanning operation, even when an error arises in generating the control signal S68 in the computer 68 and a plurality of bits become a high level in the control signal S68, the oscillation circuit 23 and the deflection circuit 112 shown in FIG. 6 will not be destroyed.

Also, according to the horizontal deflection circuit 67, since both the control of the deflection circuit 112 shown in FIG. 6 and the control of the current source 22 shown in FIG. 7 are carried out based on the control signal S61, even when the computer 10 runs out of control, synchronization can be maintained between the control of the potential of the terminal 34 of the coil $L_3$ by a controller 133 shown in FIG. 5 and the horizontal synchronization pulse signal S69 of the oscillation circuit 23 shown in FIG. 7. As a result, it is possible to prevent application of a higher voltage than a determined reference voltage between a base and a collector of the transistor $Tr_2$ of the deflection circuit 112 shown in FIG. 5. Thus, the deflection circuit 112 can be properly protected. Also, according to the horizontal deflection circuit 67, since no special protective circuits are provided, the circuit can be made smaller and simpler.

Also, according to the horizontal deflection circuit 67, since the computer 68 outputs a control signal S68 only to the AFC circuit 61 and does not control the deflection circuit 112, processing in the computer 68 can be simplified.

Also, according to the horizontal deflection circuit 67, during a multiscanning operation, since 256 frequencies are expressed by an 8-bit control signal S61 and frequencies are identified by decoding the control signal S61 in the controller 133 of the deflection circuit 112, only eight wirings are necessary for transferring the control signal S61. Compared with a case where 256 wirings were provided, the number of wirings can be largely reduced.

The present invention is not limited in the above embodiments.

For example, in the above explained horizontal deflection circuit 57c shown in FIG. 1, a case was given where the computer 50 outputted the control signal S10b for multiscanning, however, in a case where the horizontal deflection circuit 57c is used only for multiscanning, the computer 50 may generate a control signal S10b for point scanning wherein only one bit out of 8 bits becomes a high level.

Figure 18:
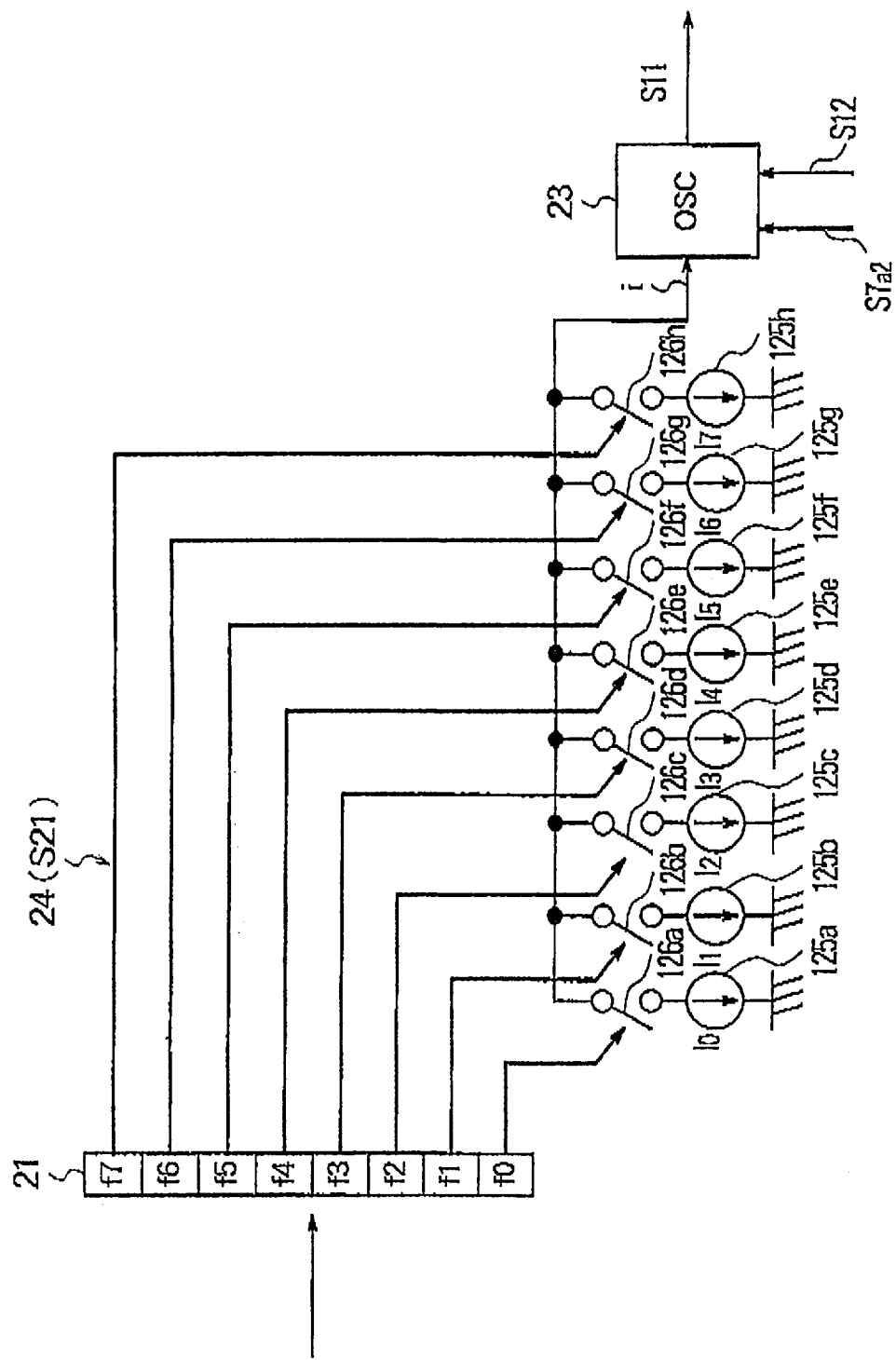
FIG. 18 is a view of the configuration of an AFC circuit of a horizontal deflection circuit for performing a point scanning operation.

In this case, as the current source 22 shown in FIG. 2, constant current sources 125a to 125h which output constant currents $I_0$ to $I_7$ corresponding to eight frequencies predetermined and fixed for point scanning as shown in FIG. 18 are used.

Also, in the above embodiment, 8-bit signals were given as examples of control signals S10b and S68 output from the computers 50 and 68, however, the number of bits of control signals S10b and S68 is not specifically limited. It can be, for example, 2 bits, 4 bits, 16 bits, or 32 bits.

Also, in the above embodiments, as shown in FIGS. 2 and 7, an example was given wherein a plurality of constant current sources outputting a constant current value of a power of two of a reference constant current value I were provided as a current source 22, however, any current value can be set to these constant current sources.

Also, the configuration of the oscillation circuit 23 shown in FIGS. 2 and 7 is not limited to what is shown in FIG. 3.

Also, the configuration of the deflection circuit 112 shown in FIGS. 1 and 6 is not limited to what is shown in FIG. 5.

Also, the decoder 62 shown in FIG. 8 can change a plurality of fixed frequencies in a point scanning ope ration by changing the type of connection between the decoding use wiring $80_0$ to $80_7$ and the input terminals of the NOR circuits $73_0$ to $73_7$.

Also, the decoder 62 shown in FIG. 8 was configured by using NOR circuits, however, for example, NAND circuits, OR circuits, and NOT circuits can also be used.

Summarizing the effects of the invention, as explained above, according to the horizontal electron-beam deflector, automatic frequency controller, and horizontal electron-beam deflector of the present invention, generation of a horizontal synchronization pulse signal in the automatic frequency controlling means and control of a peak voltage of the horizontal synchronization pulse signal in the horizontal deflection signal generating means can be carried out by using the same control signal. Therefore, for example, even when a processing means for generating a control signal runs out of control, synchronization of the automatic frequency controlling means and the horizontal deflection signal generating means can be maintained. As a result, the horizontal deflection signal generating means is always operatable within a region considered in design, and destruction of the horizontal deflection signal generating means can be prevented.

Also, according to the horizontal electron-beam deflector, automatic frequency controller, and horizontal electron-beam deflector of the present invention, it is possible to prevent the horizontal deflection signal generating means from being destroyed with a small and simple configuration.

While the invention has been described with reference to specific embodiments chosen for purpose of illustration, it should be apparent that numerous modifications could be made thereto by those skilled in the art without departing from the basic concept and scope of the invention.

What is claimed is:

1. A horizontal electron-beam deflector for generating a horizontal deflection signal to be supplied to a horizontal deflection coil for generating a magnetic field to deflect an electron beam in a horizontal direction in response to a horizontal synchronization signal extracted from a video signal, comprising:

a processing means for detecting a frequency of said horizontal synchronization signal;

an automatic frequency controlling means having a current generating circuit for generating a control signal, an oscillation signal generating circuit for generating an oscillation signal having an oscillation frequency in accordance with said control signal, and a horizontal synchronization pulse signal generating circuit for generating a horizontal synchronization pulse signal based on said oscillation signal and a comparison signal in response to said horizontal synchronization signal and horizontal deflection signal; and a horizontal deflection signal generating means for generating a horizontal deflection signal based on said horizontal synchronization pulse signal while controlling a peak voltage to be maintained constant based on said control signal input from said automatic frequency controlling means.

2. A horizontal electron-beam deflector as set forth in claim 1, wherein said automatic frequency controlling means comprises a storage circuit for storing said control signal output from said processing current and outputting the control signal stored in said storage circuit to said horizontal deflecting signal generating means.

3. A horizontal electron-beam deflector as set forth in claim 1, wherein:

said current generating circuit of said automatic frequency controlling means comprises;
  a plurality of constant current sources corresponding to a number of bits of said control signal and
  a plurality of switches provided respectively and correspondingly to said plurality of constant current sources and being in either a state of connection or disconnection in response to a value of a corresponding bit of said control signal;
said automatic frequency controlling means generates a current equivalent to a total constant current output from said constant current sources provided corresponding to switches in said connected state among switches in a connected state in said plurality of switches.

4. A horizontal electron-beam deflector as set forth in claim 3, wherein said plurality of constant current sources output constant currents for generating an oscillation signal having an oscillation frequency in response to a horizontal synchronization signal having different frequencies from each other.

5. An automatic frequency controller for generating a horizontal synchronization pulse signal in a horizontal deflection signal generating means which is used for generating a horizontal deflection signal to be supplied to a horizontal deflection coil for generating a magnetic field for deflecting an electron beam in a horizontal direction based on a horizontal synchronization signal detected from a video signal; comprising:

a storage circuit for storing an input control signal derived from an Automatic Frequency Control means in response to a frequency of a detected horizontal synchronization signal and outputting said stored control signal to said horizontal deflection signal generating means:
  a current generating circuit for generating a current in response to said control signal;
  an oscillation signal generating circuit for generating an oscillation signal having an oscillation frequency in accordance with said current; and
  a horizontal synchronization pulse signal generating circuit for generating a horizontal synchronization pulse signal based on said oscillation signal and a comparison signal in response to said horizontal synchronization signal and horizontal deflection signal.

6. An automatic frequency controller as set forth in claim 5, wherein said current generating circuit comprises:

a plurality of constant current sources corresponding to a number of bits of said control signal and a plurality of switches provided respectively and correspondingly to said plurality of constant current sources and being in either a state of connection or disconnection in response to a value of a corresponding bit of said control signal, and generates a current equivalent to a total constant current output from said constant current sources provided corresponding to switches in said connected state among switches being in a connected state in said plurality of switches.

7. A video signal receiver for extracting a horizontal synchronization signal from a received video signal, generating a horizontal deflection signal from said horizontal synchronization signal in a horizontal electron-beam deflector, making a horizontal deflection coil generate a magnetic field in response to said horizontal deflection signal; and deflecting an electron beam emitted from a cathode to reach a fluorescent panel, comprising:

a processing means for detecting a frequency of said horizontal synchronization signal;

an automatic frequency controlling means having a signal generating circuit for generating a control signal, an oscillation signal generating circuit for generating an oscillation signal having an oscillation frequency in accordance with said control signal, and a horizontal synchronization pulse signal generating circuit for generating a horizontal synchronization pulse signal based on said oscillation signal and a comparison signal in response to said horizontal synchronization signal and horizontal deflection signal; and a horizontal deflection signal generating means for generating a horizontal deflection signal based on said horizontal synchronization pulse signal while controlling a peak voltage to be maintained constant based on said control signal output from said automatic frequency controlling means.

8. A video signal receiver as set forth in claim 7, wherein said current generating circuit comprises:

a plurality of constant current sources corresponding to a number of bits of said control signal and a plurality of switches provided respectively and correspondingly to said plurality of constant current sources and being in either a state of connection or disconnection in response to a value of a corresponding bit of said control signal and generates a current equivalent to a total constant current output from said constant current sources provided corresponding to switches in said connected state among switches being in a connected state in said plurality of switches.

9. A horizontal electron-beam deflector for generating a horizontal deflection signal to be supplied to a horizontal deflection coil for generating a magnetic field to deflect an electron beam in a horizontal direction in response to a horizontal synchronization signal extracted from a video signal, comprising:

a processing means for detecting a frequency of said horizontal synchronization signal and generating a first control signal in response to the detected frequency;

an automatic frequency controlling means having a current generating circuit for generating a second control signal, an oscillation signal generating circuit for generating an oscillation signal having an oscillation frequency in accordance with said current, and a horizontal synchronization pulse signal generating circuit for generating a horizontal synchronization pulse signal based on said oscillation signal and a comparison signal in response to said horizontal synchronization signal and horizontal deflection signal;

a horizontal deflection signal generating means for generating a horizontal deflection signal based on said horizontal synchronization pulse signal while controlling a peak voltage to be maintained constant based on said second control signal output from said automatic frequency controlling means;

said current generating circuit of said automatic frequency controlling means comprises;
 a plurality of constant current sources corresponding to a number of bits of said first control signal and
 a plurality of switches provided respectively and corresponding to said plurality of constant current sources and being in either a state of connection or disconnection in response to a value of a corresponding bit of said first control signal;

said automatic frequency controlling means generates a current equivalent to a total constant current output from said constant current sources provided corresponding to switches in said connected state among switches in a connected state in said plurality of switches;

wherein said plurality of constant current sources respectively output constant currents of a power of 2 which have different reference constant currents.

10. A horizontal electron-beam deflector as described in claim 9, wherein:
 said plurality of switches become connected in state when a respectively corresponding bit of control signal is at a first level and becomes disconnected in state when at a second level, said processing means generates said control signal constituted by a plurality of bits wherein each bit is at a first level or a second level so as to indicate said detected frequency within a predetermined range of frequencies.

11. A horizontal electron-beam deflector for generating a horizontal deflection signal to be supplied to a horizontal deflection coil for generating a magnetic field to deflect an electron beam in a horizontal direction in response to a horizontal synchronization signal extracted from a video signal, comprising:
 a processing means for detecting a frequency of said horizontal synchronization signal and generating a first control signal in response to the detected frequency;
 an automatic frequency controlling means having a current generating circuit for generating a second control signal, an oscillation signal generating circuit for generating an oscillation signal having an oscillation frequency in accordance with said current, and a horizontal synchronization pulse signal generating circuit for generating a horizontal synchronization pulse signal based on said oscillation signal and a comparison signal in response to said horizontal synchronization signal and horizontal deflection signal;
 a horizontal deflection signal generating means for generating a horizontal deflection signal based on said horizontal synchronization pulse signal while controlling a peak voltage to be maintained constant based on said second control signal output from said automatic frequency controlling means;
 said current generating circuit of said automatic frequency controlling means comprises;
  a plurality of constant current sources corresponding to a number of bits of said first control signal; and
  a plurality of switches provided respectively and corresponding to said plurality of constant current sources and being in either a state of connection or disconnection in response to a value of a corresponding bit of said first control signal;
 said automatic frequency controlling means generates a current equivalent to a total constant current output from said constant current sources provided corresponding to switches in said connected state among switches in a connected state in said plurality of switches;
 wherein said plurality of constant current sources output constant currents for generating an oscillation signal having an oscillation frequency in response to a horizontal synchronization signal having different frequencies from each other;
 said plurality of switches become connected in state when a respectively corresponding bit of first control signal is at a first level and become disconnected in state when at a second level; and
 said processing means generates said first control signal wherein a plurality of bits respectively indicate a predetermined fixed frequency different from each other and only one bit corresponding to said detected frequency is set to be at a first level.

12. A horizontal electron-beam deflector for generating a horizontal deflection signal to be supplied to a horizontal deflection coil for generating a magnetic field to deflect an electron beam in a horizontal direction in response to a horizontal synchronization signal extracted from a video signal, comprising:
 a processing means for detecting a frequency of said horizontal synchronization signal and generating a first control signal in response to the detected frequency;
 an automatic frequency controlling means having a current generating circuit for generating a second control signal, an oscillation signal generating circuit for generating an oscillation signal having an oscillation frequency in accordance with said current, and a horizontal synchronization pulse signal generating circuit for generating a horizontal synchronization pulse signal based on said oscillation signal and a comparison signal in response to said horizontal synchronization signal and horizontal deflection signal;
 a horizontal deflection signal generating means for generating a horizontal deflection signal based on said horizontal synchronization pulse signal while controlling a peak voltage to be maintained constant based on said second control signal output from said automatic frequency controlling means;
 wherein said automatic frequency controlling means further comprises:
  a first module for phase-locking an oscillation signal of an oscillation frequency in accordance with a current generated based on said first control signal to said horizontal synchronization signal and
  a second module for generating said horizontal synchronization pulse signal by adjusting said oscillation signal based on results of comparison of a phase of said oscillation signal and a phase of said comparison signal in said locked state.

13. A horizontal electron-beam deflector for generating a horizontal deflection signal to be supplied to a horizontal deflection coil for generating a magnetic field to deflect an electron beam in a horizontal direction in response to a horizontal synchronization signal extracted from a video signal, comprising:

a processing means for detecting a frequency of said horizontal synchronization signal and generating a first control signal in response to the detected frequency;

an automatic frequency controlling means having a current generating circuit for generating a second control signal, an oscillation signal generating circuit for generating an oscillation signal having an oscillation frequency in accordance with said current, and a horizontal synchronization pulse signal generating circuit for generating a horizontal synchronization pulse signal based on said oscillation signal and a comparison signal in response to said horizontal synchronization signal and horizontal deflection signal;

a horizontal deflection signal generating means for generating a horizontal deflection signal based on said horizontal synchronization pulse signal while controlling a peak voltage to be maintained constant based on said second control signal output from said automatic frequency controlling means;

wherein said horizontal deflection signal generating means comprises a control circuit for controlling potential to be applied to a portion generating said horizontal deflection signal in order that a peak voltage of said horizontal deflection signal becomes constant based on said first control signal.

14. A horizontal electron-beam deflector as set forth in claim 13, wherein:

said horizontal deflection signal generating means comprises:

a first transistor wherein an emitter is grounded and said horizontal synchronization pulse signal is applied to a base;

a second transistor wherein a emitter is grounded and said horizontal deflection signal is generated at a collector; and a transformer provided with a primary coil connected to a collector of said first transistor and a secondary-order coil connected to a base of said second transistor; and said control circuit controls potential to be applied to a collector of said second transistor so as to maintain a peak voltage of said horizontal deflection signal based on said control signal.

* * * * *